United States Patent
Yoo et al.

(10) Patent No.: US 8,503,230 B2
(45) Date of Patent: Aug. 6, 2013

(54) ACCESS METHOD OF NON-VOLATILE MEMORY DEVICE

(75) Inventors: Han Woong Yoo, Seoul (KR); KyoungLae Cho, Yongin-si (KR); Seung-Hwan Song, Suwon-si (KR); Heeseok Eun, Yongin-si (KR); Hong Rak Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 200 days.

(21) Appl. No.: 12/588,532

(22) Filed: Oct. 19, 2009

(65) Prior Publication Data

US 2010/0149868 A1 Jun. 17, 2010

(30) Foreign Application Priority Data

Dec. 12, 2008 (KR) .................. 10-2008-0126551

(51) Int. Cl.
*G11C 11/34* (2006.01)
*G11C 16/04* (2006.01)

(52) U.S. Cl.
USPC ............. 365/185.03; 365/185.19; 365/185.22

(58) Field of Classification Search
USPC ....................... 365/185.01–185.33
See application file for complete search history.

(56) References Cited

U.S. PATENT DOCUMENTS

| | | | |
|---|---|---|---|
| 6,522,580 B2 | 2/2003 | Chen et al. | |
| 6,870,768 B2 | 3/2005 | Cernea et al. | |
| 7,102,924 B2 | 9/2006 | Chen et al. | |
| 7,372,730 B2 | 5/2008 | Chen | |
| 7,567,455 B2 * | 7/2009 | Khaef | 365/185.02 |
| 7,684,237 B2 * | 3/2010 | Moschiano et al. | 365/185.02 |
| 7,859,922 B2 * | 12/2010 | Aritome | 365/189.18 |
| 2003/0002348 A1 | 1/2003 | Chen et al. | |
| 2005/0018482 A1 | 1/2005 | Cemea et al. | |
| 2005/0117401 A1 | 6/2005 | Chen et al. | |
| 2005/0162913 A1 | 7/2005 | Chen | |
| 2007/0091677 A1 | 4/2007 | Lasser et al. | |
| 2007/0159881 A1 | 7/2007 | Sato et al. | |
| 2007/0211536 A1 | 9/2007 | Aritome | |
| 2007/0280000 A1 | 12/2007 | Fujiu et al. | |
| 2008/0084754 A1 * | 4/2008 | Mokhlesi | 365/185.21 |
| 2009/0003057 A1 | 1/2009 | Kang et al. | |
| 2009/0016103 A1 | 1/2009 | Kang et al. | |
| 2009/0067237 A1 | 3/2009 | Lee et al. | |

FOREIGN PATENT DOCUMENTS

| | | |
|---|---|---|
| JP | 2007-184040 | 7/2007 |
| JP | 2007-519162 | 7/2007 |
| JP | 2008-084485 | 4/2008 |
| KR | 10-2007-0007283 | 1/2007 |
| KR | 10-2007-0074477 | 7/2007 |
| KR | 10-2007-0115755 | 12/2007 |
| KR | 10-2008-0016544 | 2/2008 |
| KR | 10-2008-0029861 | 4/2008 |
| KR | 10-2009-0039173 | 4/2009 |
| WO | WO 2005/073978 | 8/2005 |

* cited by examiner

*Primary Examiner* — Kretelia Graham
(74) *Attorney, Agent, or Firm* — Harness, Dickey & Pierce, P.L.C.

(57) ABSTRACT

Disclosed is an access method of a non-volatile memory device which comprises detecting a threshold voltage variation of a first memory cell, the a threshold voltage variation of the first memory cell being capable of physically affecting a second memory cell; and assigning the second memory cell to a selected sub-distribution from among a plurality of sub-distributions according to a distance of the threshold voltage variation of the first memory cell, the plurality of sub-distributions corresponding to a target distribution of the second memory cell.

16 Claims, 26 Drawing Sheets

Fig. 14
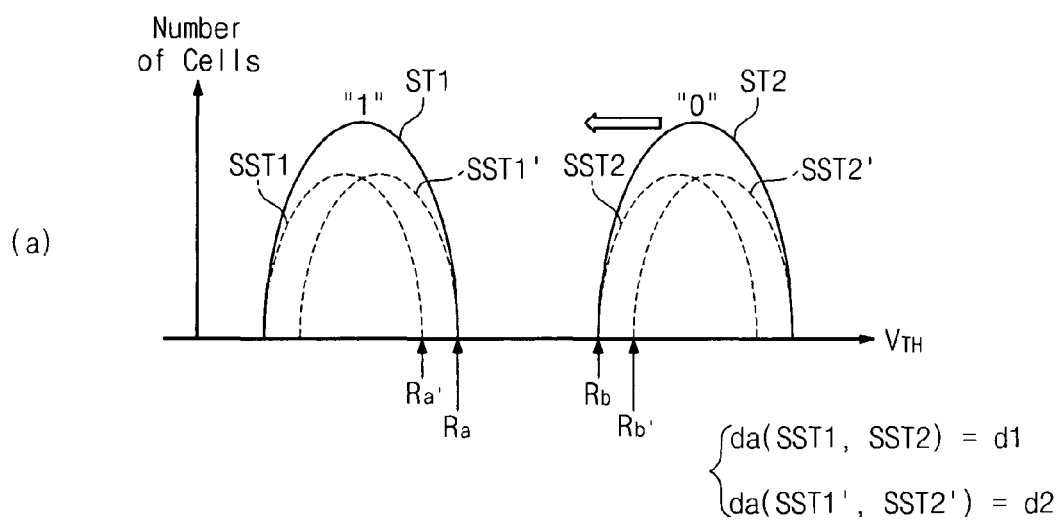
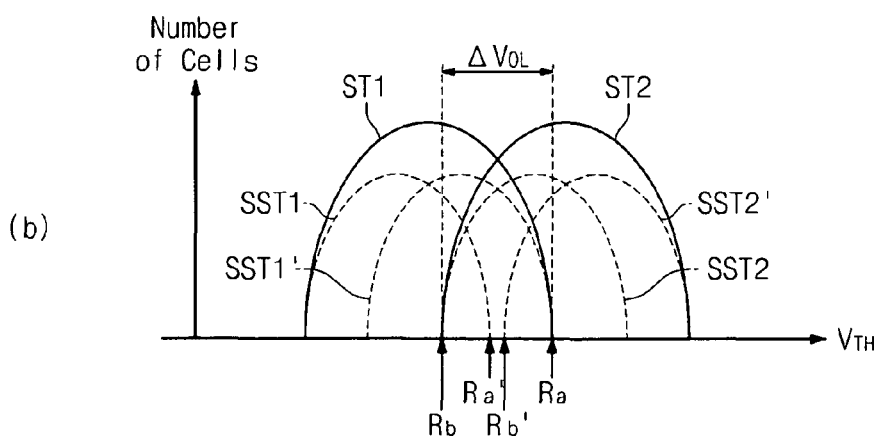

ACCESS METHOD OF NON-VOLATILE MEMORY DEVICE

FOREIGN PRIORITY STATEMENT

This U.S. non-provisional patent application claims priority under 35 U.S.C §119 of Korean Patent Application No. 10-2008-0126551, filed on Dec. 12, 2008, the entire contents of which is are incorporated herein by reference.

BACKGROUND

Example embodiments relate to a semiconductor memory device. More particularly, example embodiments relate to a nonvolatile memory device and an access method thereof.

Semiconductor memory devices may be divided into volatile memory devices and non-volatile memory devices. The volatile memory devices may perform read and write operations at a relatively high speed, and may lose data at power-off. Alternatively, the non-volatile memory devices may retain data after power-off. Therefore, the non-volatile memory devices may be preferable for storing contents which must be retained regardless of whether or not power is on.

Among the non-volatile memory devices, flash memory may be widely used with, for example, computers, memory cards, and the like. Flash memory may be divided into a NOR type and a NAND type according to an interconnection state of cells and bit lines. A NOR-type flash memory may have an array structure in which two or more cell transistors are connected in parallel with one bit line. NOR-type flash memory may store data using a Channel Hot Electron (CHE) method and may erase data using a Fowler-Nordheim (FN) tunneling method. A NAND-type flash memory may have an array structure in which two or more cell transistors are connected in series with one bit line. NAND-type flash memory may store and erase data using the FN tunneling method.

Each memory cell of a flash memory may store 1-bit data or multi-bit data. In the event that one memory cell stores 1-bit data, the memory cell may have a threshold voltage corresponding to any one of two threshold voltage states, for example data '1' or data '0'. If one memory cell stores 2-bit data, the memory cell may have a threshold voltage corresponding to any one of four threshold voltage states. If one memory cell stores 3-bit data, the memory cell may have a threshold voltage corresponding to any one of eight threshold voltage states. Recently, various techniques for storing 4 or more data bits in one memory cell have been developed.

SUMMARY

Example embodiments provide a non-volatile memory device and access method which may be capable of providing highly reliable read data.

Example embodiments provide an access method of a non-volatile memory device which may comprise detecting a threshold voltage variation of a first memory cell, the threshold voltage variation of a first memory cell being capable of physically affecting a second memory cell; and assigning the second memory cell to a selected sub-distribution from among a plurality of sub-distributions according to a distance of the threshold voltage variation of the first memory cell, the plurality of sub-distributions corresponding to a target distribution of the second memory cell.

Example embodiments provide a memory system which may comprise a non-volatile memory device; and a memory controller which may be configured to control the non-volatile memory device. The memory controller may access the non-volatile memory device according to an access method which may include detecting a threshold voltage variation of a first memory cell capable of physically affecting a second memory cell; and assigning the second memory cell to a selected sub-distribution from among a plurality of sub-distributions according to a distance of the threshold voltage variation of the first memory cell, the plurality of sub-distributions corresponding to a target distribution of the second memory cell.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIGS. 14A and 14B are diagrams for describing another read method of according to example embodiments.

DETAILED DESCRIPTION OF EXAMPLE EMBODIMENTS

Figure 1:
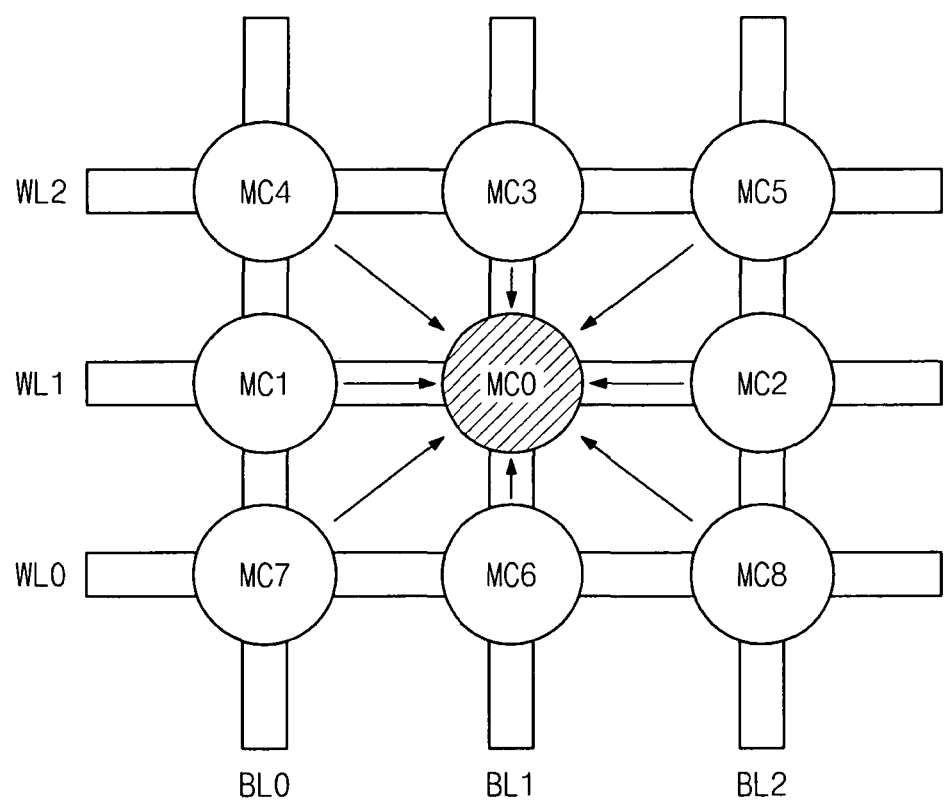
FIG. 1 is a diagram showing a cell array of a non-volatile memory according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Below, characteristics and functions of example embodiments will be described with reference to a non-volatile NAND-type flash memory device. However, it is well comprehended that one skilled in the art would recognize applications of example embodiments other than a non-volatile NAND-type flash memory device. Further, the term "distribution" as used in this disclosure may refer to the number of memory cells corresponding to each of different threshold voltages of memory cells in a specific unit (for example, page, block, chip, etc.). Below, example embodiments will be more fully described with reference to accompanying drawings.

FIG. 1 is a diagram showing a cell array 100 of a non-volatile memory. Referring to FIG. 1, at a program operation, a memory cell (for example, MC0) may be physically affected by adjacent or surrounding memory cells (for example, MC1 to MC8). Though the memory cell MC0 is not programmed, a threshold voltage of the memory cell MC0 may be shifted due to the memory cells MC1 to MC8 which physically affect the cell MC0. Hereinafter, the affecting memory cells MC1 to MC8 are referred to as aggressor cells, and the affected memory cell MC0 is referred to as a victim cell.

A coupling effect is a representative phenomenon associated with shifting of a threshold voltage. A threshold voltage of the memory cell MC0, the victim cell, may be shifted from an originally programmed threshold voltage due to the coupling effect. The coupling effect will be described as an example of a threshold voltage shift. However, threshold voltages of memory cells may be shifted by various causes other than the coupling effect. For example, threshold voltages of memory cells may vary due to deterioration of oxide films according to a time lapse, hot temperature stress (HTS), program/erase cycling, and the like. Alternatively, a threshold voltage of a memory cell MC0 may be shifted upward due to program disturbance caused by programming of peripheral cells. A variation of a threshold voltage of the memory cell MC0 according to charge loss of aggressor cells MC1 to MC8 may be considered as the physical influence which aggressor cells inflict on the victim cell. Alternatively, a distribution may be deteriorated by the lateral charge spreading by which charge is shifted into peripheral cells due to characteristics of an element, for example a floating gate (a charge trap layer) of a charge trap flash (CTF) memory. Adjacent cells causing the physical influence may be changed according to various program ways. A shift of a threshold voltage of the memory cell MC0 is not limited to a specific operation. A threshold voltage of the memory cell MC0 may be affected by memory cells MC1, MC2, MC3, and MC6 according to whether the memory cell MC0 is connected with the same bit line BL1 as memory cells MC3 and MC6 or whether it is connected with the same word line WL1 as memory cells MC1 and MC2.

Threshold voltages of memory cells may be shifted due to the above-described causes. Accordingly, adjacent threshold voltage distributions may overlap each other because the read margin may be reduced due to the voltage threshold shift. When adjacent threshold voltage distributions overlap, read data may include plural erroneous bits. However, with a read voltage setting method according to example embodiments, it may be possible to solve problems caused by the threshold voltage shift. In particular, it may be possible to classify the coupling or retention influence caused by peripheral memory cells and to estimate characteristics (for example, a lower limit voltage of a distribution, an upper limit voltage thereof, an error rate, etc.) with respect to each of classified distributions. Further, with an analyzing method according to example embodiments, each of the overlapped distributions may be divided into a plurality of sub-distributions according to coupling influence.

A memory access may be made by selecting memory cells which experience the coupling influence caused by peripheral cells identically or similarly, based on the divided distributions. In accordance with this analyzing method, it may be possible to provide read voltages corresponding to various requirements. According to example embodiments, it may be possible to set a read voltage with a specific reliability and to provide a DC parameter of a non-volatile memory device according to a distance of the coupling which a read cell experiences.

Figure 2:
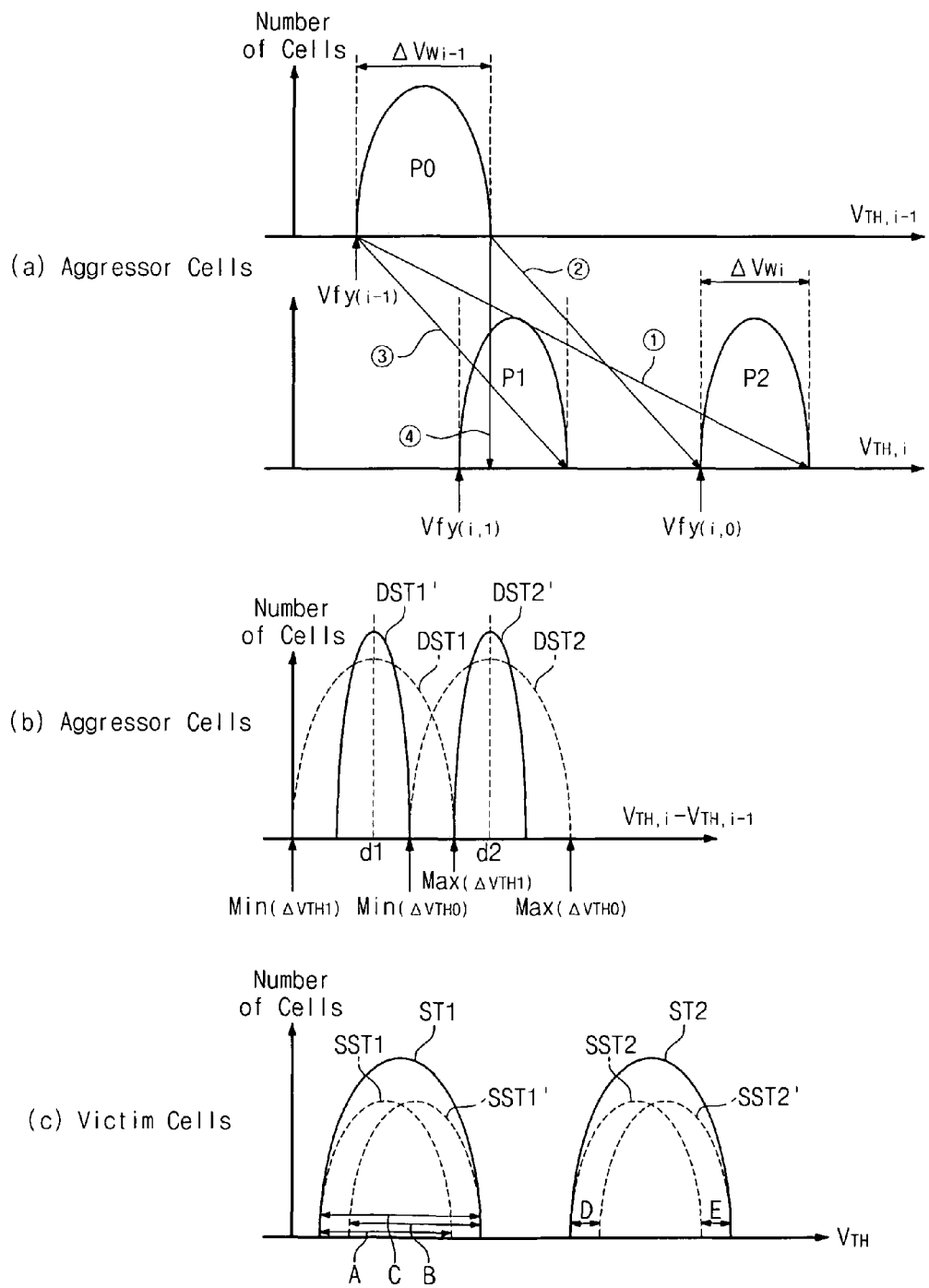
FIGS. 2A to 2C are diagrams for describing threshold voltage up-shift of victim cells due to aggressor cells.

FIGS. 2A to 2C are diagrams for describing threshold voltage up-shift of victim cells due to aggressor cells. A variation of a threshold voltage of a victim cell (for example, cell at an MC0 position) due to variations of threshold voltages of aggressor cells (for example, cells at MC3 position) will be described with reference to FIGS. 2A to 2C. The coupling due to an aggressor cell MC3 may be considered to simply model the influence of peripheral cells.

FIGS. 2A and 2B show a threshold voltage variation according to programming of aggressor cells. FIG. 2A shows variations of threshold voltages of aggressor cells which are programmed to distributions P1 and P2 from a distribution P0, respectively. Hereinafter, the value 'i' is used to indicate a time of programming. Before programming, the distribution P1 of aggressor cells may have a verification voltage Vfy(i−1) and a distribution width $\Delta V_{Wi-1}$. If programmed to two different states, aggressor cells may have a distribution P1 having a verification voltage Vfy(i, 1) and a distribution width $\Delta V_{Wi}$ and a distribution P2 having a verification voltage Vfy(i, 0) and a distribution width $\Delta V_{Wi}$. In FIG. 2A, an arrow ① indicates the greatest threshold voltage variation. Arrow ① illustrates an example of the case where an aggressor cell having the lowest threshold voltage in the distribution P0 is programmed to the highest threshold voltage in the distribution P2. In FIG. 2A, an arrow ② indicates the least threshold voltage variation of an aggressor cell programmed to the distribution P2. An arrow ③ indicates the most threshold voltage variation of an aggressor cell programmed to the distribution P1. An arrow ④ indicates the least of all threshold voltage variations.

FIG. 2B shows a distribution of varied widths of threshold voltages of aggressor cells programmed to the distributions P1 and P2 from the distribution P0. A varied width ($V_{TH}$,i−$V_{TH}$,i−1) of threshold voltages of aggressor cells programmed to P1 from P0 is illustrated by a delta distribution DST1. A varied width ($V_{TH}$,i−$V_{TH}$,i−1) of threshold voltages of aggressor cells programmed to P2 from P0 is illustrated by a delta distribution DST2.

The delta distributions DST1 and DST2 may have an overlapped region. The delta distribution DST1 may indicate a relatively small threshold voltage variation and may have d1 as an average value of a threshold voltage variation. The maximum value of the delta distribution DST1 may correspond to the case illustrated by the arrow ③ and marked by Max($\Delta$VTH1). The minimum value of the delta distribution DST1 may correspond to the case illustrated by the arrow ④ and marked by Min($\Delta$VTH1). However, a voltage Vfy(i,1) may be set to zero when the voltage Vfy(i,1) is less than (Vfy(i−1)+$\Delta V_{Wi-1}$). For ease of description, example embodiments will be described under this condition. Accordingly, if the above condition is changed, the equation may be adjusted somewhat. The delta distribution DST2 may indicate a relatively large threshold voltage variation and may have d2 as an average value of a threshold voltage variation. The maximum value of the delta distribution DST2 may correspond to the case illustrated by the arrow ① and marked by Max($\Delta$VTH0). The minimum value of the delta distribution DST2 may correspond to the case illustrated by the arrow ② and marked by Min($\Delta$VTH0). The delta distributions DST1 and DST2 may represent examples of distributions extracted according to the above-described calculation manner. However, threshold voltage variations of aggressor cells generated in practice may be illustrated by delta distributions DST1' and DST2'.

FIG. 2C shows the physical influence of victim cells due to threshold voltage variations of aggressor cells. Distributions ST1 and ST2 illustrate different program states of victim cells. The distribution ST1 may be divided into sub-distributions SST1 and SST1' based on the coupling influence corresponding to each of threshold voltage variations DST1 and DST2 of aggressor cells. The distribution ST1 may be divided into the sub-distribution SST1 of memory cells, which experience no coupling influence or relatively low coupling influence, and the sub-distribution SST1' of memory cells, which experience relatively high coupling influence. Further, the distribution ST2 may be divided into sub-distributions SST2 and SST2' based on the coupling influence corresponding to each of threshold voltage variations DST1 and DST2 of aggressor cells. The distribution ST2 may be divided into the sub-distribution SST2 of memory cells, which experience no coupling influence or relatively low coupling influence, and the sub-distribution SST2' of memory cells, which experience relatively high coupling influence. With reference to FIG. 2C, an example in which each distribution is divided into two sub-distributions (for example SST1, SST1'; and SST2, SST2') according to the coupling influence is described. The example of a classification standard discussed above is provided for ease of description. According to example embodiments, each distribution may be classified into three or more sub-distributions according to the coupling influence. If the distances of threshold voltage variations of aggressor cells are known, boundary values of distributions of victim cells may be measured and corrected sufficiently by estimation, calculation, or test values.

Calculation of distribution widths A and B may be made by the following equation. The distribution width A may indicate a width of each of the sub-distributions SST1 and SST2 experiencing relatively low coupling influence, and the distribution width B may indicate a width of each of the sub-distributions SST1' and SST2' experiencing relatively high coupling influence.

$$A = \Delta V_{Wi-1} + C_y \text{Max}(\Delta VTH1)$$

$$B = \Delta V_{Wi-1} + C_y \{\text{Max}(\Delta VTH0) - \text{Min}(\Delta VTH0)\}$$

In the equation, $C_\gamma$ may represent a constant indicating a coupling ratio.

A distribution width C indicating a width of the distribution ST1 may be calculated by the following equations.

$$C = \Delta V_{Wi-1} + C_y \text{Max}(VTH0)$$

$$C = \Delta V_{Wi-1} + C_y \{Vfy(i,0) - Vfy(i-1) + V_{Wi-1}\}$$

Threshold voltage widths D and E defining differences between upper threshold voltages and lower threshold voltages of respective sub-distributions may be expressed by the following equations.

$$D = C_y \text{Min}(\Delta VTH0)$$

$$E = C_y \{\text{Max}(\Delta VTH0) - \text{Max}(\Delta VTH1)\}$$

It may be possible to estimate the physical influence (for example, coupling) of victim cells due to aggressor cells by considering the above-described equations.

Figure 3:
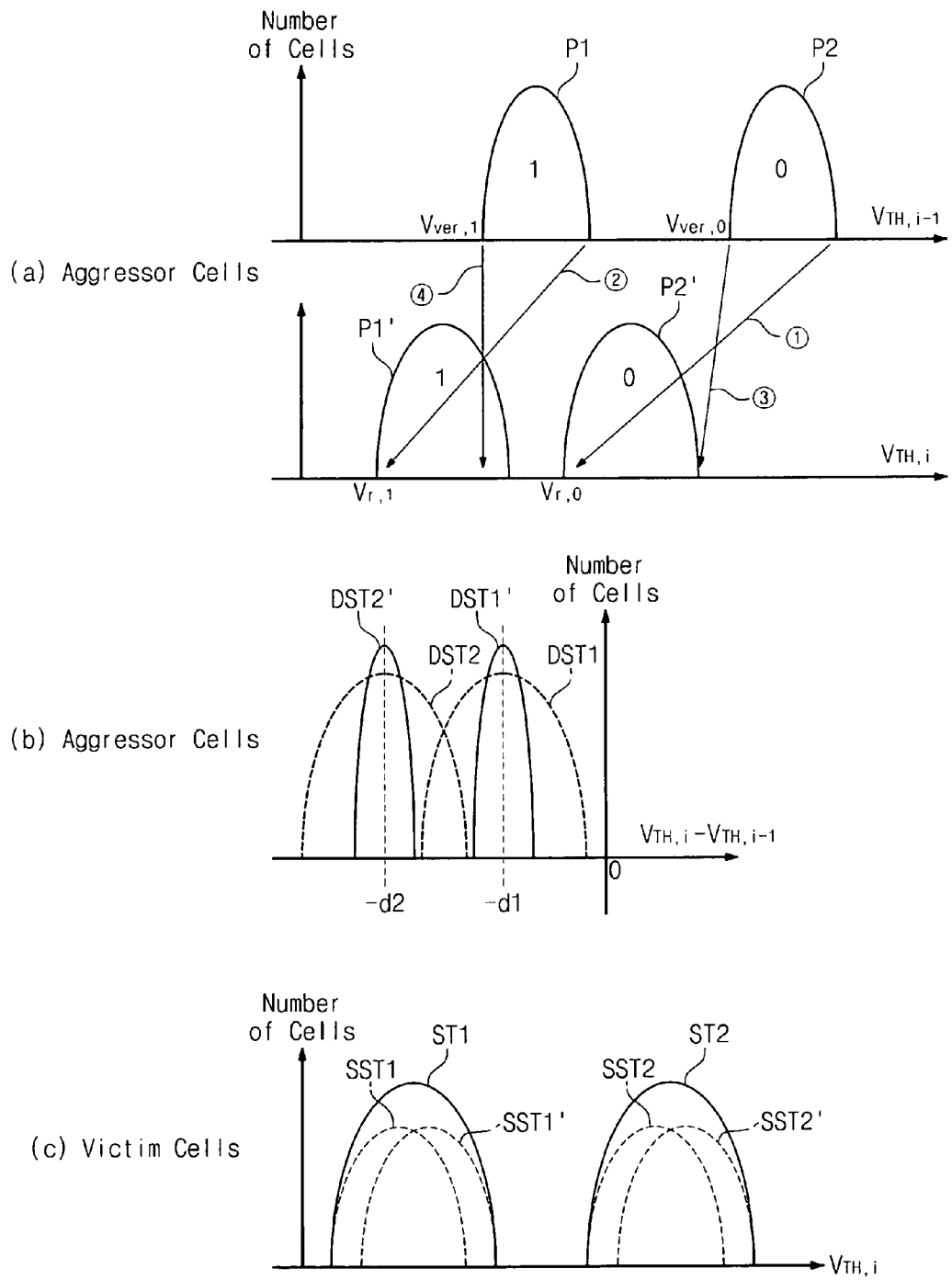
FIGS. 3A to 3C are diagrams illustrating an example of threshold voltage down-shift of victim cells due to aggressor cells.

FIGS. 3A to 3C are diagrams showing threshold voltage down-shift of victim cells due to aggressor cells. FIGS. 3A to 3C illustrate a phenomenon in which charge loss, which may be caused by aggressor cells over a period of time, forces threshold voltages of victim cells to be shifted. The coupling caused by programming of aggressor cells may be determined based on only aggressor cells which are programmed later than victim cells. However, all aggressor cells around victim cells may be considered to model the physical influence of aggressor cells due to charge loss.

Referring to FIG. 3A, threshold voltage distributions P1 and P2 of aggressor cells may be down shifted to threshold voltage distributions P1' and P2' due to a factor, for example, a time lapse. However, decrease in threshold voltages of aggressor cells may be differentiated from the coupling effect. Over a given period of time, memory cells having higher threshold voltages may experience more voltage drop than memory cell having lower threshold voltages. A threshold voltage decrease width caused when the distribution P2 is shifted into the distribution P2' may be greater than a threshold voltage decrease width caused when the distribution P1 is shifted into the distribution P1'. Accordingly, the maximum threshold voltage displacement width of the distribution P2 marked by an arrow ① is more than the maximum threshold voltage displacement width of the distribution P1 marked by an arrow ②. Arrows ③ and ④ may indicate memory cells whose threshold voltage displacement widths are relatively less than the maximum threshold voltage displacement widths marked by ① and ②.

FIG. 3B is a distribution diagram illustrating distributions P1 and P2 of aggressor cells down shifting to distributions P1' and P2', respectively. A delta distribution DST2 having an average value –d2 may indicate a displacement width of memory cells whose threshold voltages are changed to the distribution P2' from the distribution P2. A delta distribution DST1 having an average value –d1 may indicate a displacement width of memory cells whose threshold voltages are changed to the distribution P1' from the distribution P1. Unlike the coupling, since threshold voltages of aggressor cells are lowered, a threshold voltage displacement width may have a negative value. In the event that memory cells with the same threshold voltages experience charge loss at a similar rate, threshold voltage displacement distributions may be illustrated by distributions DST1' and DST2' which may have more narrow ranges than models DST1 and DST2 and may show characteristics of charge loss. The delta distributions DST1 and DST2 may be regarded as upper and lower boundary conditions.

FIG. 3C illustrates threshold voltage variations of victim cells due to threshold voltage variations of aggressor cells. Distributions ST1 and ST2 may indicate different program states of victim cells, respectively. The distribution ST1 may be divided into sub-distributions SST1 and SST1' based on the coupling influence corresponding to each of threshold voltage variations DST1 and DST2 of aggressor cells. The distribution ST1 may divided into the sub-distribution SST1 of memory cells which may be affected a relatively low amount by charge loss of aggressor cells, and the sub-distribution SST1' of memory cells, which may be affected a relatively high amount by the charge loss of the aggressor cells. Further, the distribution ST2 may be divided into sub-distributions SST2 and SST2' based on the coupling influence corresponding to each of threshold voltage variations DST1 and DST2 of aggressor cells. The distribution ST2 may be divided into the sub-distribution SST2 of memory cells which may be affected a relatively low amount by charge loss of aggressor cells, and the sub-distribution SST2' of memory cells which may be affected a relatively high amount by the charge loss of the aggressor cells. With reference to FIG. 3C, an example in which each distribution may be divided into two sub-distributions (for example SST1, SST1'; and SST2, SST2') according to the coupling influence is described. The example of a classification standard discussed above is provided for ease of description. According to example embodiments, each distribution may be classified into, for example, three or more sub-distributions according to the coupling influence. If the distances of threshold voltage variations of aggressor cells are known, boundary values of distributions of victim cells may be measured and corrected sufficiently by estimation, calculation, or test values.

Figure 4:
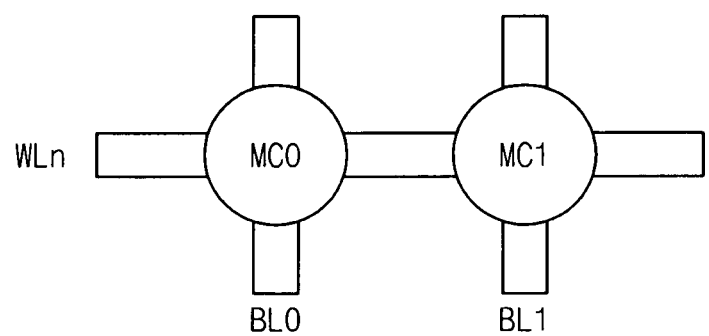
FIG. 4 is a diagram for describing lateral charge spreading.

FIG. 4 is a diagram for describing lateral charge spreading. Referring to FIG. 4, program disturbance may arise between adjacent cells connected with the same word line. Additionally, the physical influence may be described using lateral charge spreading which may be caused at cells of a charge trap flash (CTF) memory. Cells of the CTF memory may have non-conductive floating gates. At fabrication, the floating gate may be formed by a charge trap layer which may be continuous between adjacent memory cells MC0 and MC1. As memory cells are scaled down, it may be necessary to consider the lateral charge spreading due to a concentration difference of injected charge. The above-described phenomena may be modeled using a difference of charge injected in a floating gate of each of aggressor and victim cells. The lateral charge spreading phenomenon may be caused between memory cells connected with the same bit line BL0 or BL1.

FIGS. 5A and 5B are diagrams showing threshold voltage states of memory cells in FIG. 4. FIG. 5A illustrates a program state ST0 of a memory cell MC0 and a program state ST1 of a memory cell MC1. It is assumed that the memory cell MC0 may correspond to the program state ST0 and the memory cell MC1 may correspond to the program state ST1. A threshold voltage difference $\Delta V_{TH}$ may exist between the adjacent memory cells MC0 and MC1. The threshold voltage difference $\Delta V_{TH}$ may have the maximum value max$\Delta V_{TH}$ and the minimum value min$\Delta V_{TH}$. It is assumed that the program state ST0 my have a distribution width $\Delta V_{W0}$ and the program state ST1 may have a distribution width $\Delta V_{W1}$.

FIG. 5B illustrates a distribution DST of memory cells with respect to the above-described threshold voltage difference $\Delta V_{TH}$. Modeling values of respective distributions may be expressed by:

$$\max\Delta V_{TH} = Vfy1 - Vfy0 + \Delta V_{W1}$$

$$\min\Delta V_{TH} = Vfy1 - Vfy0 - \Delta V_{W0}$$

A distribution DST may indicate a theoretical value of a threshold voltage difference extracted from the above equations. Thus, in case of practical memory cells, the distribution DST may have a lower threshold voltage difference than a distribution DST'.

As a result, due to a difference between threshold voltages of adjacent memory cells, one memory cell may become an aggressor cell and the other memory cell may become a victim cell.

Figure 5:
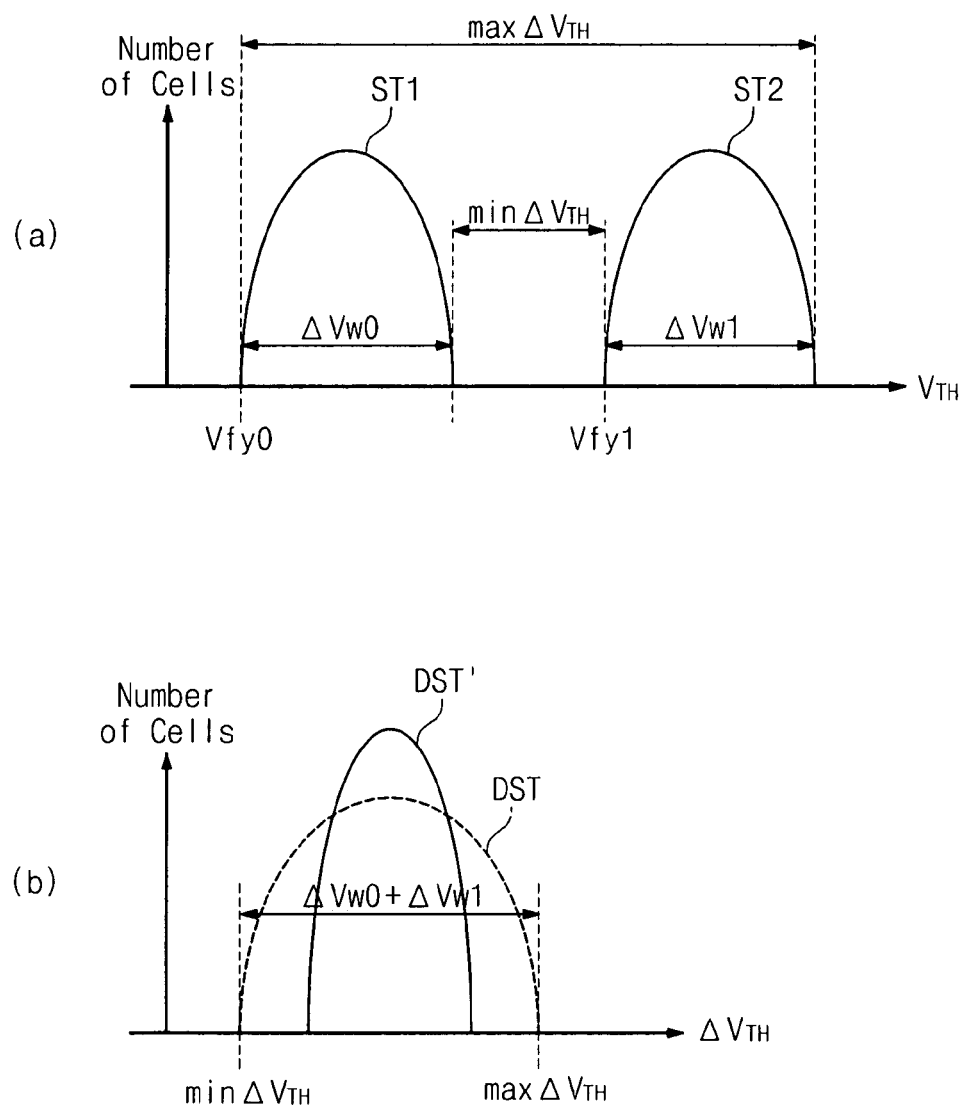
FIGS. 5A and 5B are diagrams showing threshold voltage states of memory cells in FIG. 4.
Figure 6:
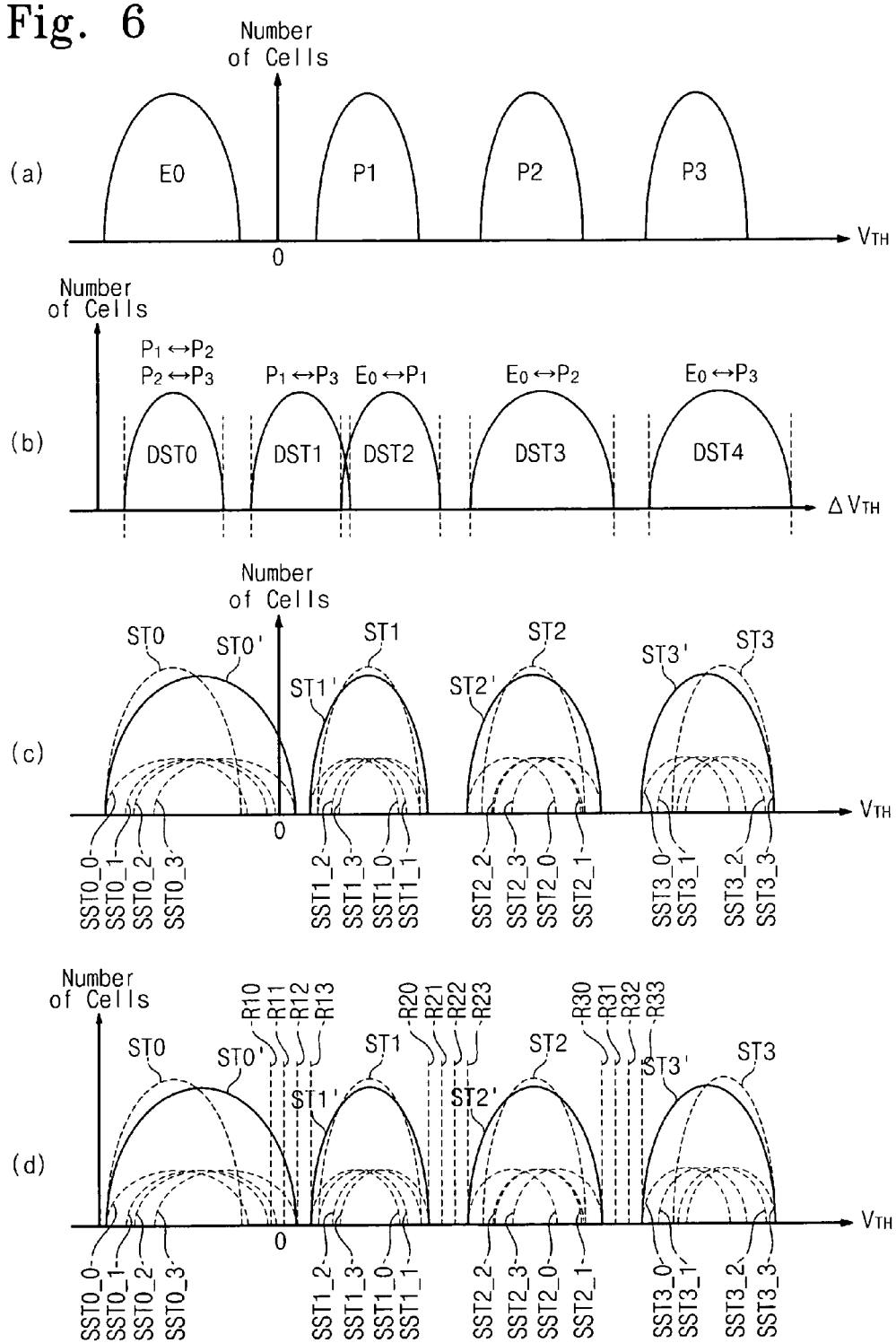
FIGS. 6A to 6D are diagrams for describing a method of analyzing memory cells in FIG. 5.

FIGS. 6A to 6D are diagrams for describing a method of analyzing memory cells in FIG. 5. FIG. 6A shows a program result of a 2-bit multi-level cell, which may have any one of an erase state E0 and three program states P1, P2, and P3.

FIG. 6B show distributions DST0 to DST4 of memory cells according to a threshold voltage difference $\Delta V_{TH}$ of memory cells MC0 and MC1. Distribution DST0 illustrates an example in which the memory cells MC0 and MC1 have program states P1 and P2, respectively, and that the memory cells MC0 and MC1 have program states P2 and P3, respectively, according to a threshold voltage difference $\Delta V_{TH}$ between the two cells MC0 and MC1. The distribution DST0 may represent the example distribution corresponding to the minimum value among differences of threshold voltages of memory cells which have different states. Distribution DST1 illustrates an example in which the memory cells MC0 and MC1 have program states P1 and P3, respectively, according to a threshold voltage difference $\Delta V_{TH}$ between the two cells MC0 and MC1. Distribution DST2 illustrates an example in which the memory cells MC0 and MC1 have an erase state E0 and a program state P1, respectively, according to a threshold voltage difference $\Delta V_{TH}$ between the two cells MC0 and MC1. Distribution DST3 illustrates an example in which the memory cells MC0 and MC1 have an erase state E0 and a program state P2, respectively, according to a threshold voltage difference $\Delta V_{TH}$ between the two cells MC0 and MC1. Distribution DST4 illustrates an example in which the memory cells MC0 and MC1 have an erase state E0 and a program state P3, respectively, according to a threshold voltage difference $\Delta V_{TH}$ between the two cells MC0 and MC1, which may be referred to as a distance between two cells MC0 and MC1. The distribution DST4 may represent the example distribution corresponding to the maximum value among differences of threshold voltages of memory cells which have different states.

Distributions of memory cells experiencing the lateral charge spreading after a given time may be divided as illustrated in FIG. 6C, based on a state of an adjacent memory cell. Though two cells may be affected mutually, for ease of description, a memory cell MC0 will be referred to as an aggressor cell, and a memory cell MC1 will be referred to as a victim cell. A distribution of the memory cell MC1, the victim cell, may be spread as a time elapses. If the victim cell MC1 has a threshold voltage distribution ST0 corresponding to an erase state E0 initially, the victim cell MC1 may have a spread distribution ST0' due to influence of aggressor cells after a time elapses. The spread distribution ST0' may be divided into sub-distributions SST0_0, SST0_1, SST0_2, and SST0_3 according to threshold voltages of aggressor cells as described in FIG. 6B. The sub-distribution SST0_0 may indicate a victim cell distribution when a program state of an aggressor cell is an erase state E0. The sub-distribution SST0_1 may indicate a victim cell distribution when a program state of an aggressor cell is a program state P1. The sub-distribution SST0_2 may indicate a victim cell distribution when a program state of an aggressor cell is a program state P2. The sub-distribution SST0_3 may indicate a victim cell distribution when a program state of an aggressor cell is a program state P3.

If the victim cell MC1 has a threshold voltage distribution ST1 corresponding to a program state P1 initially the victim cell MC1 may have a spread distribution ST1' due to influence of aggressor cells after a time elapses. The spread distribution ST1' may be divided into sub-distributions SST1_0, SST1_1, SST1_2, and SST1_3 according to threshold voltages of aggressor cells as described in FIG. 6B. The sub-distribution SST1_0 may indicate a victim cell distribution when an aggressor cell is at a program state P1. The sub-distribution SST1_1 may indicate a victim cell distribution when an aggressor cell is at a program state P2. The sub-distribution SST1_2 may indicate a victim cell distribution when a program state of an aggressor cell is a program state P3. The sub-distribution SST1_3 may indicate a victim cell distribution when a state of an aggressor cell is an erase state E0.

If the victim cell MC1 has a threshold voltage distribution ST2 corresponding to a program state P2 initially, the victim cell MC1 may have a spread distribution ST2' due to influence of aggressor cells after a time elapses. The spread distribution ST2' may be divided into sub-distributions SST2_0, SST2_1, SST2_2, and SST2_3 according to threshold voltages of aggressor cells as described in FIG. 6B. The sub-distribution SST2_0 may indicate a victim cell distribution when a state of an aggressor cell is at a program state P2. The sub-distributions SST2_1 and SST2_2 may indicate a victim cell distribution when a state of an aggressor cell is at a program state P1 or a program state P3. Though sub-distributions SST2_1 and SST2_2 are illustrated to be separated, if distances (P1 ↔ P2) and (P2 ↔ P3) between program states are identical to each other, the sub-distributions SST2_1 and SST2_2 may converge into one distribution. The sub-distribution SST2_3 may indicate a victim cell distribution when a state of an aggressor cell is at an erase state E0. The above-described distribution division is applied to a case where a victim cell is programmed to a program state P3. It may be possible to separate sub-distributions of victim cells according to a program state of each of aggressor cells with reference to FIG. 6B.

FIG. 6D illustrates a diagram showing a read method which may be capable of compensating the influence of the lateral charge spreading or program disturbance. As illustrated in FIG. 6D, a read level for victim cells may be divided into four levels according to a state of an adjacent aggressor cell. According to example embodiments, it may be unnecessary to set a read level for an erase state ST0', and description thereof is thus omitted.

As one example, it may be assumed that a threshold voltage just after programming of a victim cell to be read corresponds to a program state ST1 and a distribution formed by program disturbance or lateral charge spreading is a state ST1'. With this assumption, if a state of an aggressor cell is a program state, erase state E0, a read voltage R10 may be provided to distinguish a sub-distribution SST1_0. In a case where a state of an aggressor cell is a program state P1, a read voltage R11 may be provided to distinguish a sub-distribution SST1_1. In a case where a state of an aggressor cell is a program state P2, a read voltage R12 may be provided to distinguish a sub-distribution SST1_2. In a case where a state of an aggressor cell is a program state P3, a read voltage R13 may be provided to distinguish a sub-distribution SST1_3.

As another example, it may be assumed that a threshold voltage just after programming of a victim cell to be read corresponds to a program state ST2 and a distribution formed by program disturbance or lateral charge spreading is a state ST2'. With this assumption, if a state of an aggressor cell is a program state, an erase state E0, a read voltage R20 may be provided to distinguish a sub-distribution SST2_0. In a case where a state of an aggressor cell is a program state P1, a read voltage R21 may be provided to distinguish a sub-distribution SST2_1. In a case where a state of an aggressor cell is a program state P2, a read voltage R22 may be provided to distinguish a sub-distribution SST2_2. In a case where a state of an aggressor cell is a program state P3, a read voltage R23 may be provided to distinguish a sub-distribution SST2_3.

As another example, it may be assumed that a threshold voltage just after programming of a victim cell to be read corresponds to a program state ST3 and a distribution formed by program disturbance or lateral charge spreading is a state ST3'. With this assumption, if a state of an aggressor cell is a program state, an erase state E0, a read voltage R30 may be provided to distinguish a sub-distribution SST3_0. In a case where a state of an aggressor cell is a program state P1, a read voltage R31 may be provided to distinguish a sub-distribution SST3_1. In a case where a state of an aggressor cell is a program state P2, a read voltage R32 may be provided to distinguish a sub-distribution SST3_2. In a case where a state of an aggressor cell is a program state P3, a read voltage R33 may be provided to distinguish a sub-distribution SST3_3.

In accordance with a read method described with reference to FIG. 6D, it is well comprehended that a read voltage may be changed differently in level in accordance with different types of aggressor cells. Unlike the coupling, the influence discussed with respect to FIGS. 6A-6D may be made non-linearly by program displacement difference of two cells. It may be preferable not to classify the influence using the displacement difference but to classify the influence via an analyzed result of the influence. For example, in a case where physical influence is remarkable when a victim cell is adjacent between two aggressor cells having an erase state E0 and a program state P3, respectively, as compared with other cases, it may be preferable to add only read voltages R13 and R30 corresponding thereto. Further, a read voltage of a victim cell may be affected by time parameters. The time parameters may include, for example, a point of time when a read operation commences, a point of time when a victim cell is programmed, a point of time when an aggressor cell is programmed, and the like. Thus, it may be possible to further adjust a voltage for reading a victim cell according a time lapse after programming.

Figure 7:
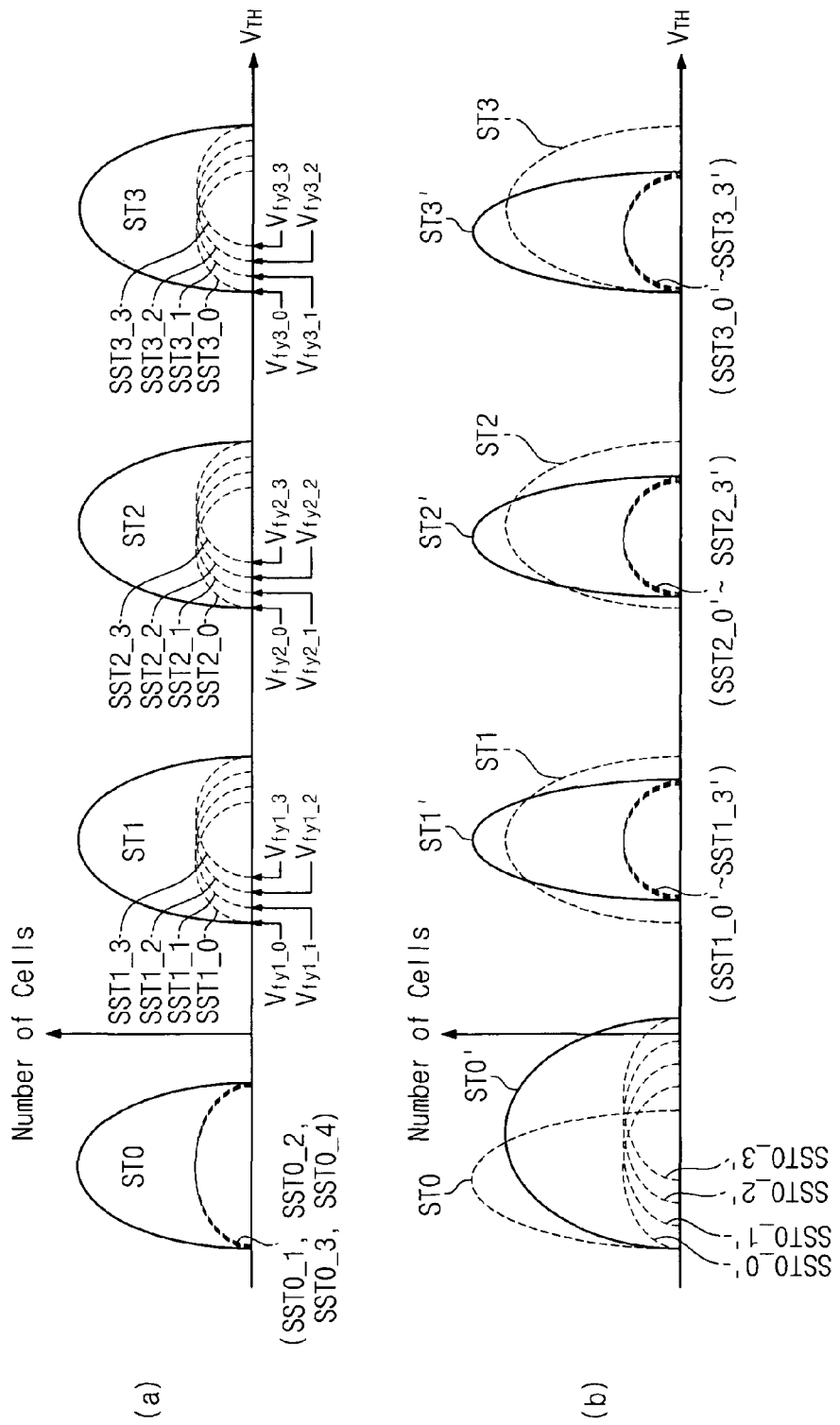
FIGS. 7A and 7B are diagrams for describing a method of addressing lateral charge spreading and program disturbance using a verification voltage.

FIGS. 7A and 7B are diagrams for describing a method of solving lateral charge spreading and program disturbance using a verification voltage. Referring to FIGS. 7A and 7B, a read level for victim cells may be divided into four levels according to a state of an adjacent aggressor cell. According to example embodiments, it may be unnecessary to set a read level for an erase state ST0', and description thereof is thus omitted.

Memory cells to be programmed to a target state ST1 will now be described. If a target state of an aggressor cell is an erase state E0, a victim cell may be programmed to a sub-distribution SST1_3. Accordingly, the victim cell may be programmed by a verification voltage Vfy1_3. If a target state of an aggressor cell is a program state P1, a victim cell may be programmed to a sub-distribution SST1_2. Accordingly, the victim cell may be programmed by a verification voltage Vfy1_2. If a target state of an aggressor cell is a program state P2, a victim cell may be programmed to a sub-distribution SST1_1. Accordingly, the victim cell may be programmed by a verification voltage Vfy1_1. If a target state of an aggressor cell is a program state P3, a victim cell may be programmed to a sub-distribution SST1_0. Accordingly, the victim cell may be programmed by a verification voltage Vfy1_0.

A program method will now be described with respect to memory cells to be programmed to a target state ST2. In a case where a target state of an aggressor cell is an erase state E0, a victim cell may be programmed to a sub-distribution SST2_3. Accordingly, the victim cell may be programmed by a verification voltage Vfy2_3. In a case where a target state of an aggressor cell is a program state P1, a victim cell may be programmed to a sub-distribution SST2_2. Accordingly, the victim cell may be programmed by a verification voltage Vfy2_2. In a case where a target state of an aggressor cell is a program state P2, a victim cell may be programmed to a sub-distribution SST2_1. Accordingly, the victim cell may be programmed by a verification voltage Vfy2_1. In a case where a target state of an aggressor cell is a program state P3, a victim cell may be programmed to a sub-distribution SST2_0. Accordingly, the victim cell may be programmed by a verification voltage Vfy2_0.

A program method will now be described with respect to memory cells to be programmed to a target state ST3. In a case where a target state of an aggressor cell is an erase state E0, a victim cell may be programmed to a sub-distribution SST3_3. Accordingly, the victim cell may be programmed by a verification voltage Vfy3_3. In a case where a target state of an aggressor cell is a program state P1, a victim cell may be programmed to a sub-distribution SST3_2. Accordingly, the victim cell may be programmed by a verification voltage Vfy3_2. In a case where a target state of an aggressor cell is a program state P2, a victim cell may be programmed to a sub-distribution SST3_1. Accordingly, the victim cell may be programmed by a verification voltage Vfy3_1. In a case where a target state of an aggressor cell is a program state P3, a victim cell may be programmed to a sub-distribution SST3_0. Accordingly, the victim cell may be programmed by a verification voltage Vfy3_0.

FIG. 7B illustrates threshold voltage variations of memory cells programmed according to the above-described program condition after time elapses or after the memory cells experience High Temperature Stress (HTS). Since setting of a verification voltage may not be made with respect to an erase state ST0, distributions may be spread according to the lateral charge spreading or program disturbance. On the other hand, distributions SST1_0 to SST1_3 of victim cells programmed by verification voltages Vfy1_0 to Vfy1_3 to have a target state ST1 may be formed of distributions SST1_0' to SST1_3', which may be overlapped preferably, according to a time lapse. Thus, an overall distribution shape may be illustrated like a distribution ST1'.

Physical influence with respect to lateral charge spreading and program disturbance, and corresponding solutions are discussed above with reference to FIGS. 4 to 7. However, by the program disturbance, a memory cell to be programmed later may act as an aggressor cell, and a threshold voltage distribution of a previously programmed victim cell may be shifted. Unlike the coupling, this influence may be made non-linearly by program displacement difference of two cells. It may be preferable not to classify the influence using the displacement difference but to classify the influence via an analyzed result of the influence. For example, in a case where physical influence is remarkable when a victim cell is adjacent between two aggressor cells having an erase state E0 and a program state P3, respectively, as compared with other cases, it may be preferable to add only a verification voltage Vfy3_3 corresponding thereto.

Figure 8:
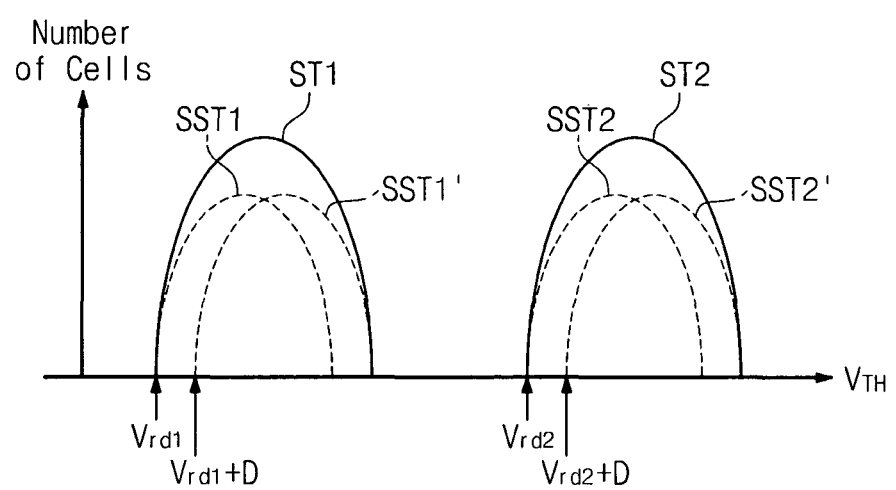
FIG. 8 is a diagram illustrating a read method according to example embodiments.

FIG. 8 is a diagram showing a read method according to example embodiments.

FIG. 8 illustrates a diagram for describing a method of acquiring data of aggressor cells prior to reading data from victim cells and determining a read voltage for victim cells according to the acquired result. If threshold voltages of victim cells are formed of distributions ST1 and ST2, read voltages Vrd1 and Vrd2 for sub-distributions SST1 and SST2 may be determined by the calculation algorithm of the above-described equations for distribution widths A to E with reference to data of aggressor cells. Read voltages (Vrd1+D) and (Vrd2+D) may be determined as voltages for reading sub-distributions SST1' and SST2' which may experience a relatively high coupling influence. A factor D may have the same value as that in the above-described equation, $D=C_y \text{Min}(\Delta VTH0)$. Alternatively, the factor D may have a value which may be measured or corrected by a test value. It may be possible to set a margin to an interval between other distributions with reference to read voltages Vrd1 and Vrd2. Thus, it may be possible to vary read voltages for victim cells with reference to the coupling influence caused by aggressor cells. Thus, the reliability of read data may be improved.

Figure 9:
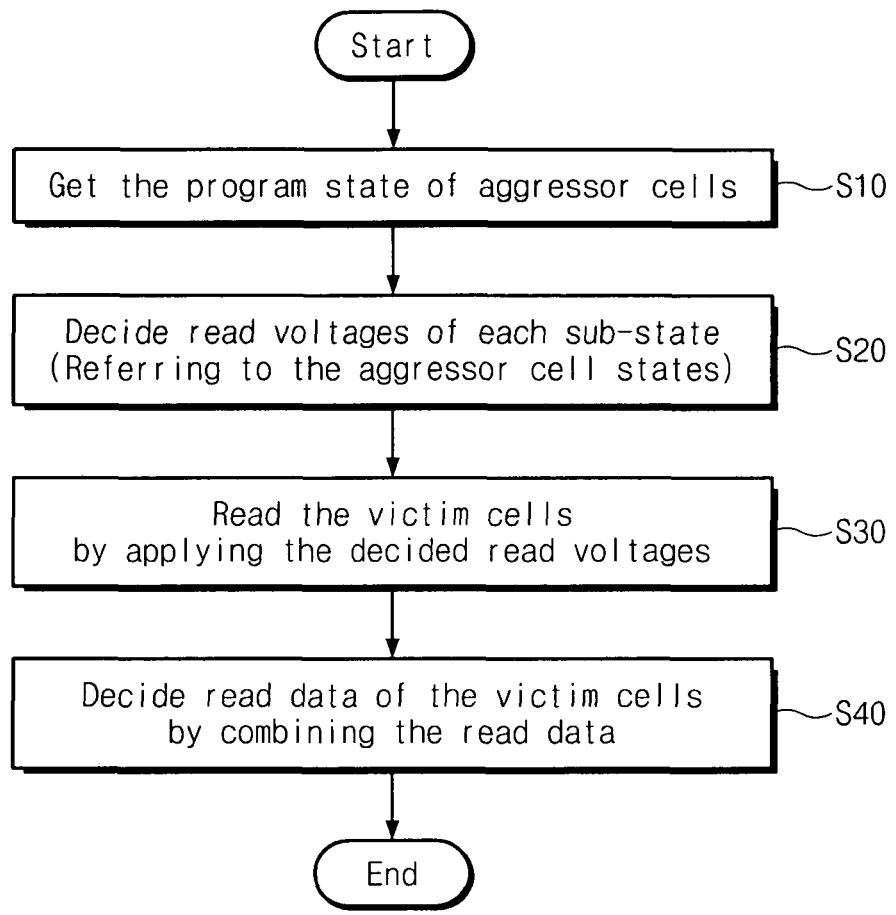
FIG. 9 is a flowchart for describing a read method according to example embodiments.

FIG. 9 is a flowchart for describing a read method according to example embodiments.

Referring to FIG. 9, if a read operation for victim cells commences, in step S10, program state information of aggressor cells may be acquired to determine a read voltage.

A general method for acquiring the program state information of aggressor cells may be to read data stored in the aggressor cells. If acquiring of the program state information of the aggressor cells is completed, a degree (or, distance) of physical influence inflicted on victim cells may be calculated with reference to data states of the aggressor cells. For example, all cells (victim cells) included in a page to be read may be classified according to the physical influence caused by aggressor cells. After victim cells to be read according to the physical influence may be divided into plural sub-distributions, in step S20, there read voltages Vrd1, (Vrd1+D), Vrd2, and (Vrd2+D) for reading sub-distributions may be determined, respectively. If the read voltages Vrd1, (Vrd1+D), Vrd2, and (Vrd2+D) are determined, in step S30, the victim cells may be read using the decided read voltages capable of distinguishing the sub-distributions, respectively. In the event that one distribution is divided into two sub-distributions, at least two or more read operations may be necessary. If victim cells are divided into more sub-distributions, a read number may increase in proportion to the more sub-distributions. In step S40, data of victim cells read by read voltages for respective divided sub-distributions may be reconfigured to one data unit (for example, a page) by combining and reprocessing procedures.

Below, a method, according to example embodiments, will be described where data is not read from aggressor cells prior to programming victim cells. According to example embodiments, it may be possible to reduce overhead of a read operation for aggressor cells by accessing the aggressor cells in a reverse order of programming.

Figure 10:
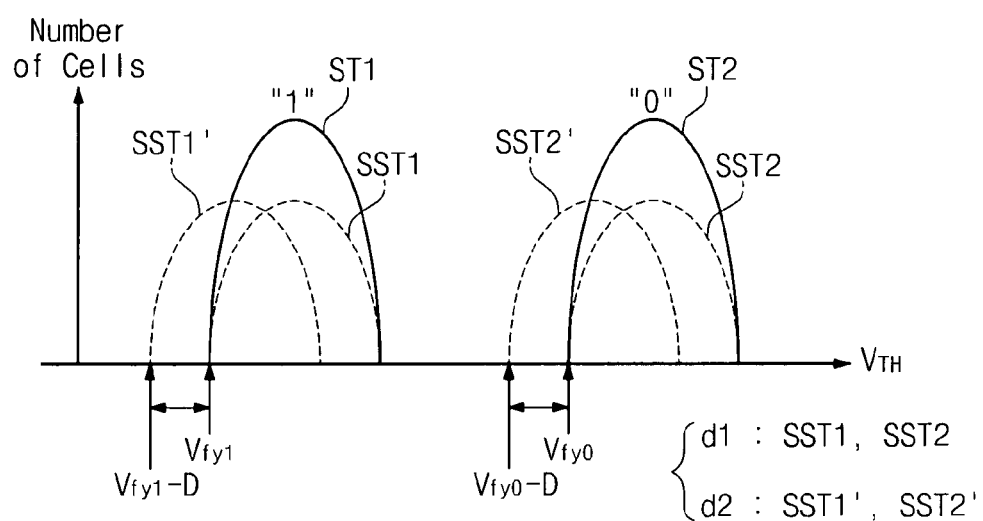
FIG. 10 is a diagram illustrating a programming method according to example embodiments.

FIG. 10 is a diagram for describing a method according to example embodiments. Referring to FIG. 10, memory cells undergoing much coupling influence may be programmed by a verification voltage lower than voltages for target states ST1 and ST2. If programming of aggressor cells is completed, victim cells may have threshold voltages corresponding to the target states ST1 and ST2 according the influence due to threshold voltage shift of the aggressor cells. A more detailed description is as follows.

Prior to programming victim cells, an operation for classifying coupling influence of victim cells inflicted by aggressor cells may be needed. Accordingly, data (hereinafter, referred to as mask data) to be programmed in aggressor cells may be acquired prior to programming victim cells. The coupling influence inflicted on the victim cells may be assigned to each of the victim cells with reference to the mask data. An example in which the coupling influence is classified into d1 and d2 will be described. Memory cells experiencing lower coupling influence, for example memory cells corresponding to distributions SST1 and SST2, may be programmed by the same verification voltages Vfy1 and Vfy0 as a target distribution. Verification voltages for victim cells experiencing higher coupling influence may be assigned to be programmed to a lower state than the target distributions ST1 and ST2. Though programming of victim cells is completed, a part of the victim cells may have threshold voltages lower than the target states ST1 and ST2. However, if programming of aggressor cells commences, memory cells SST1' and SST2' having threshold voltage states lower than target states may be programmed by the coupling to have threshold voltages corresponding to the target states ST1 and ST2. Thus, the victim cells may be programmed to have threshold voltages corresponding to target states after programming of the aggressor cells is completed.

Among memory cells which undergo much coupling influence, a verification voltage for memory cells SST1' to be programmed to a target state ST1 may be a voltage (Vfy1−D) lower than a verification voltage Vfy1 of the target distribution ST1. A verification voltage of memory cells SST2' experiencing much coupling influence may be a voltage (Vfy0−D) lower than a verification voltage Vfy0 of the target distribution ST2. After programming of the aggressor cells is completed, threshold voltages of memory cells assigned to the distribution SST1' may all increase over a voltage Vfy1. Thus, the target distribution ST1 may be formed via combination with the distribution SST1 of memory cells which may undergo less coupling influence. If programming of aggressor cells is completed, threshold voltages of memory cells assigned to the distribution SST2' may all increase over a voltage Vfy0. Thus, as programming of aggressor cells is completed, memory cells corresponding to a distribution SST2' may form the target distribution ST2 via combination with the distribution SST2 of memory cells on which less coupling influence is inflicted.

Figure 11:
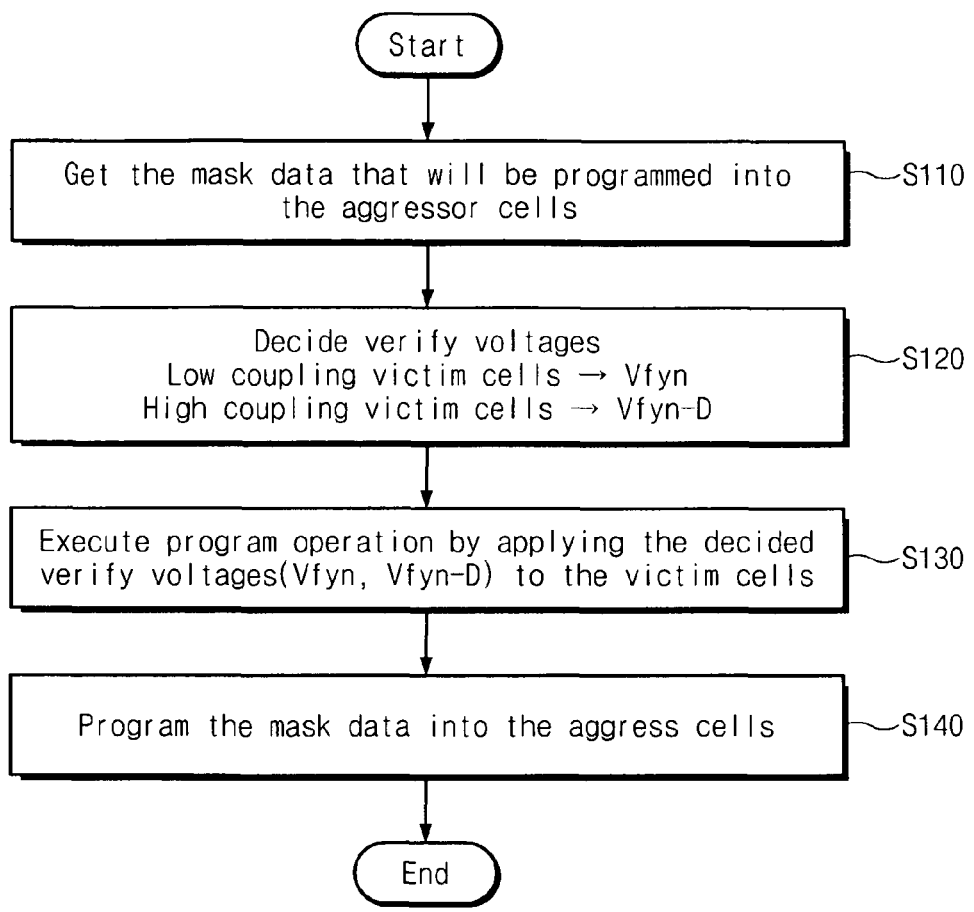
FIG. 11 is a flowchart for describing a programming method according to example embodiments.

FIG. 11 is a flowchart for describing a method according to example embodiments. A method, according to example embodiments, by which threshold voltage distributions of victim cells form target distributions when programming of victim cells and programming of aggressor cells are completed will be described with reference to FIG. 11.

Prior to programming victim cells, in step S110, mask data to be programmed to aggressor cells may be acquired. The mask data may be program data of memory cells which are programmed later than the victim cells. The coupling influence inflicted on each victim cell may be analyzed with reference to the acquired mask data. In step S120, a verification voltage Vfyn for memory cells experiencing less coupling influence may be decided and a verification voltage (Vfyn−D) for memory cells experiencing much coupling influence may be decided. After the verification voltages for the victim cells are decided, in step S130, the victim cells may be programmed using the decided verification voltages. In subsequent step S140, the aggressor cells may be programmed. If programming of the aggressor cells is completed, threshold voltages of the victim cells may be programmed to target states.

Figure 12A:
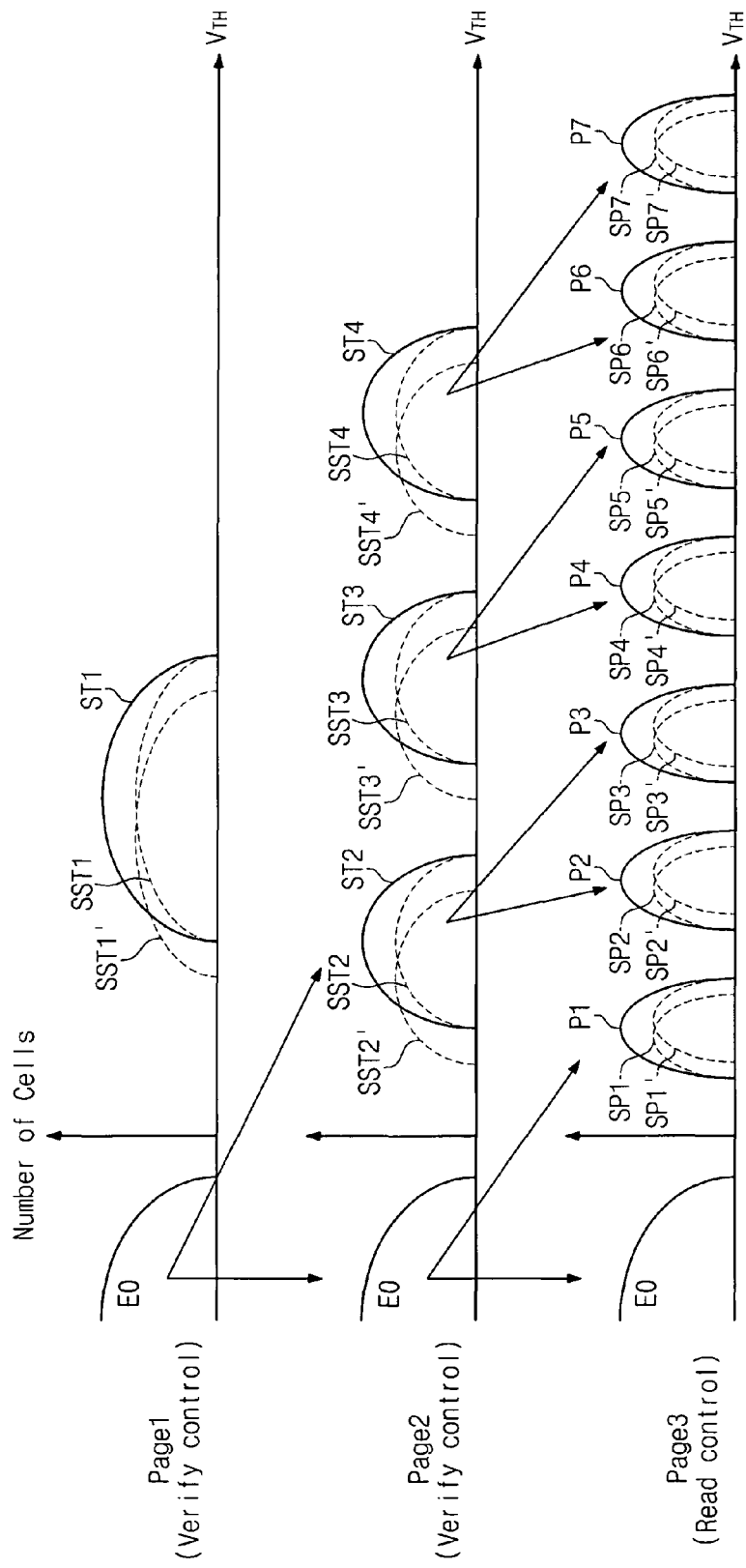
FIG. 12A is another diagram for describing a method according to example embodiments.
Figure 12B:
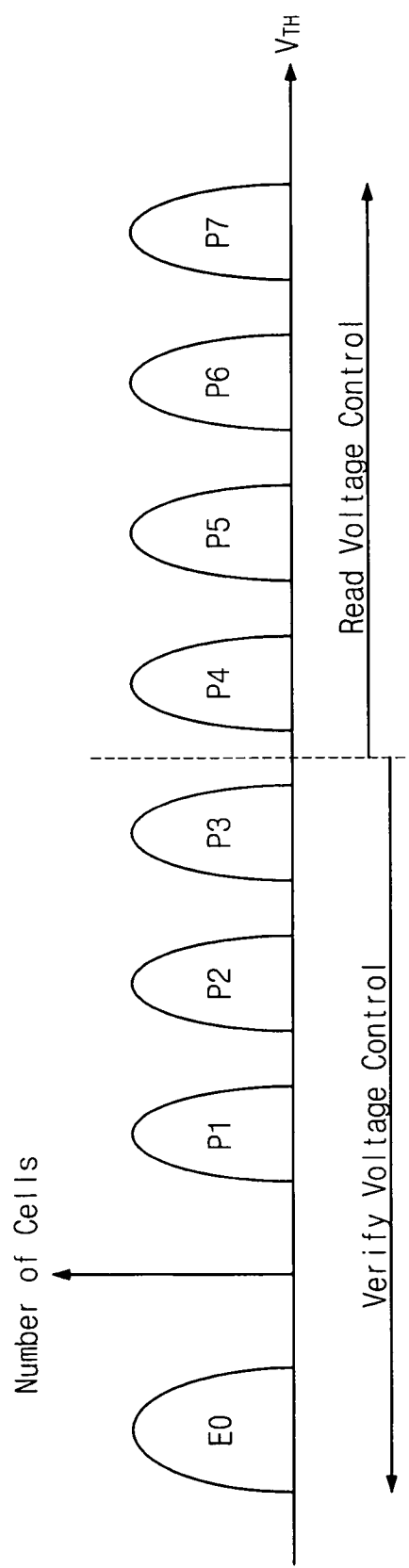
FIG. 12B is yet another diagram for describing a method according to example embodiments.

FIG. 12A is a diagram for describing a method according to example embodiments, and FIG. 12B is a diagram for describing another method according to example embodiments.

Referring to FIG. 12A, it may be possible to access a non-volatile memory device in parallel with the above-described embodiments. According to example embodiments, it may be possible to improve the reliability of data read from memory cells by using a read method and a program method together. The read method may include applying a read voltage which is varied according to the degree of the physical influence caused by aggressor cells. The program method may include applying a verification voltage which is varied according to the degree of the physical influence caused by aggressor cells. In case of a multi-bit cell which stores multi-bit data, it may be determined whether either one of the program method and the read method is used according to a page to be programmed.

FIG. 12A illustrates a read method and a program method, according to example embodiments, that are selectively used according to a cell characteristic of a page. A page programmed before an LSB page or an MSB page may be programmed using such a program method that includes varying a verification voltage. The first page, which may be an LSB page, and the second page may be programmed using a program method where a verification voltage is changed according to the influence of aggressor cells. For example, at a program operation of the first page, memory cells to be programmed to a target state ST1 may be supplied with a verification voltage corresponding to a sub-distribution SST1 or SST1' with reference to mask data to be programmed to aggressor cells. If programming of the aggressor cells is completed, threshold voltages of the victim cells corresponding to the sub-distribution SST1' may increase. Accordingly, the victim cells may be programmed to the target state ST1. At a program operation of the second page, memory cells to be programmed to target states ST2, ST3, and ST4 may be supplied with verification voltages corresponding to sub-distributions (SST2, SST2'), (SST3, SST3'), and (SST4, SST4') with reference to mask data to be programmed to aggressor cells. If programming of the aggressor cells is completed, threshold voltages of the victim cells corresponding to the sub-distributions SST2', SST3', and SST4' may be increased. Accordingly, the victim cells may be programmed to the target distributions ST2, ST3, and ST4.

Further, the third page (or, an MSB page) may be programmed using a method in which a read voltage is changed. For a final MSB page of a plurality of pages, it may be possible to reduce overhead by using a read method where a read voltage is controlled by analyzing aggressor cells. In the manner described above with reference to FIG. 9, it may be possible to provide a read voltage by dividing distributions Pi into sub-distributions SPi and SPi' ($1 \leq i \leq 7$) with reference to data of aggressor cells at a read operation.

Although memory cells are in the same page, memory cells corresponding to relatively higher threshold voltage distributions (for example, P4 to P7) may be accessed via the read method according to example embodiments. Although memory cells are in the same page, memory cells corresponding to relatively lower threshold voltage distributions (for example, P1 to P3) may be accessed via the program method according to example embodiments. Applying the read method or the programming method according to example embodiments based on the type of threshold voltage distribution is illustrated in FIG. 12B. In accordance with this manner in FIG. 12B, it is possible to widen a voltage window by reducing deterioration of oxide films of memory cells in lower distributions.

Figure 13:
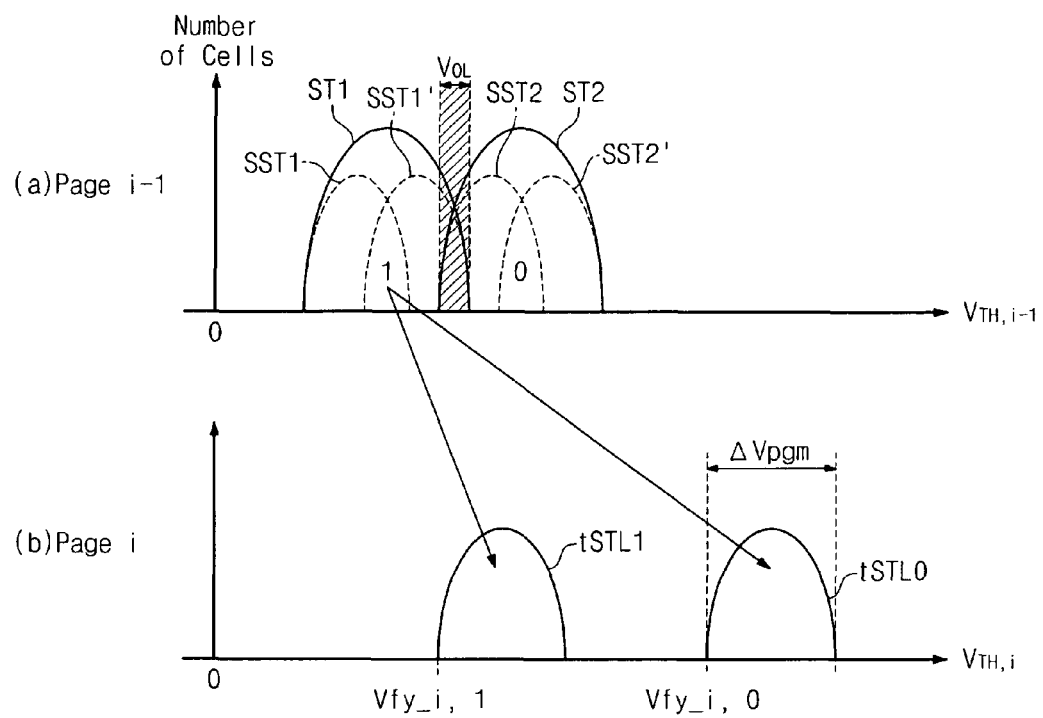
FIGS. 13A and 13B are diagrams illustrating an initial reading according to example embodiments.

FIGS. 13A and 13B are diagrams showing an initial read operation according to example embodiments. Referring to FIGS. 13A and 13B, the reliability of a program operation may be improved by dividing the coupling influence when multi-level cells are programmed. An initial read operation for reading data of a previous page to program one page will now be described.

To program an upper page, a multi-bit flash memory device may execute an initial read operation of reading a program result of a previous page stored in memory cells. Threshold voltage positions of respective cells may be judged by the initial read operation, and the upper page may be programmed based on the threshold voltage positions. In program steps of each page, since a relatively high word line voltage may be applied to a selected word line, program disturbance may arise due to the coupling. Further, electrons injected in a floating gate of a memory cell via a program operation may be leaked according to a time lapse. Thus, a threshold voltage distribution of memory cells may be shifted upward or downward.

FIG. 13A illustrates a program state of an (i−1)th page. As the (i−1)th page is programmed, all cells of the (i−1)th page may become aggressor cells. In case of a memory which is configured to program multi-bit data in a shadow programming scheme, aggressor cells may be memory cells placed at an upper or lower side. Memory cells physically adjacent to one another and in a different page (odd-numbered or even-numbered page) of the same word line may act as an aggressor cell. At an initial read operation for an (i−1)th page, a serious problem may arise at an overlap region $V_{OL}$ of two distributions ST1 and ST2. A memory cell in which the (i−1)th page is programmed to have a distribution ST2 may be sensed by the initial read operation as if it is included in a distribution ST1. Accordingly, a 1-bit error may arise at the initial read operation. As illustrated in FIG. 13B, a memory cell misread via the initial read operation may not be programmed to a target distribution from a distribution ST2 by programming of the (i−1)th page, but programmed to a distribution tST1_0 or tST1_1 from the distribution ST1. This may cause a fail at all algorithm operations including the read method realized by a program state unit.

With the initial read method according to example embodiments, it may be possible to detect levels of threshold voltages set by programming of the (i−1)th page in aggressor cells placed around a victim cell. Levels of threshold voltages of aggressor cells may be detected in the same manner described above with reference to FIG. 9. Two overlapped distributions ST1 and ST2 may be divided into sub-distributions (SST1, SST2; and SST1', SST2') based on threshold voltage states of aggressor cells, respectively. The sub-distributions (SST1, SST2; and SST1', SST2'), divided according the physical influence due to aggressor cells, may not overlap each other. A result of the initial read operation may include no errors.

As described above, data misread by the initial read operation of a multi-bit flash memory device may affect an operation to be conducted subsequently. The 1-bit error caused at the initial read operation may cause a decrease in the performance of read and program algorithms, which may be executed by a program state unit. It may be possible to provide a reliable multi-bit flash memory device by applying a distribution dividing manner according to example embodiments to the initial read operation.

In particular, by performing an initial read operation with reference to the physical influence due to aggressor cells, it may be possible to improve such a reliability problem that the coupling effect increases as programming of multi-level cells progresses to an upper page. In the event that a method according to example embodiments is applied to the initial read operation, a relatively high step voltage ΔVpgm may be used, so that a program speed may be improved. Further, it may be easy to acquire program states of aggressor cells for measuring their influence. In the event that a page buffer scheme with a plurality of latches is used to program a plurality of pages, an (i−1)th page may have to be retained via the latches. The (i−1)th page of aggressor cells may be used to classify distributions at an initial read operation. Thus, the above-described initial read method may be used without structure modification of a memory device or additional accessing.

FIGS. 14A and 14B are diagrams for describing another read method according to example embodiments. Referring to FIG. 14A, if threshold voltages of victim cells constitute distributions ST1 and ST2, sub-distributions SST1 and SST2 may be decided according to the above-described equations (related to A to E) with reference to data of aggressor cells. Further, sub-distributions SST1' and SST2', the coupling influence of which may be higher, may be decided. A case where distributions ST1 and ST2 overlap according to threshold voltage shifting may be considered. Overlapping distributions are illustrated in FIG. 14B. Although overlapping of the distributions ST1 and ST2 indicating threshold voltages of victim cells is divided into sub-distributions with reference to the influence of aggressor cells, it may be difficult to handle the complication thereof. As illustrated in FIG. 14B, voltages Ra, Ra', Rb, and Rb' for deciding boundary values of sub-distributions SST1, SST1', SST2, and SST2' are illustrated in an overlapped threshold voltage region $\Delta V_{OL}$. These voltages may be determined according to an overlapped level of the distributions ST1 and ST2. Overlapping sub-distributions like those illustrated in FIG. 14B may necessitate a read method capable of reducing overhead of a controller.

Figure 15:
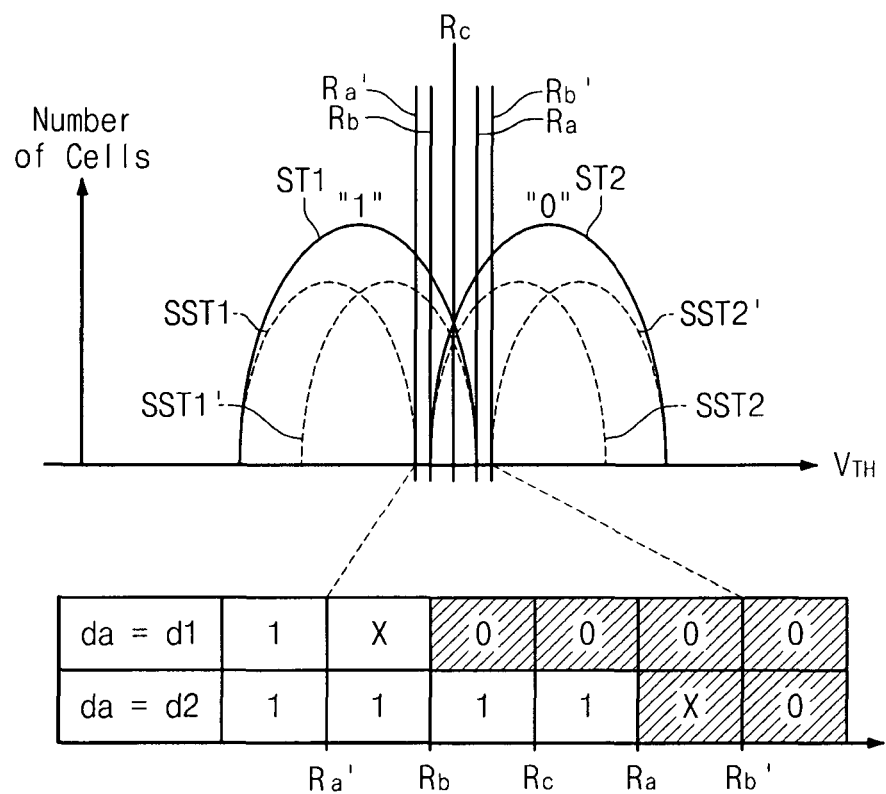
FIGS. 15 to 18 are diagrams illustrating read methods for overlapping sub-distributions according to example embodiments.

FIG. 15 is a diagram showing a read method in a case where sub-distributions SST1' and SST2' overlap each other partially. FIG. 15 illustrates a read method which may be used in the event that a lower limit voltage Rb' of the sub-distribution SST2 is higher than an upper limit voltage Ra' of the sub-distribution SST1.

If distributions are judged to be overlapped as illustrated in FIG. 15 according to an analysis result for aggressor cells, a fine or interval read operation may be performed in which read voltages Ra', Rb, Ra, and Rb' are used. In case of sub-distributions SST1 and SST2 experiencing less coupling influence from aggressor cells, data may be judged according to a reference corresponding to a distance (da=d1) of the coupling. According to example embodiments, in case of memory cells included in the sub-distributions SST1 and SST2, memory cells having threshold voltages higher than a read voltage Rb may be judged to correspond to logic '0', and memory cells having threshold voltages lower than a read voltage Ra' may be judged to correspond to logic '1'. In the event that division is made by the sub-distributions SST1 and SST, no memory cells may exist between a read voltage Ra' and a read voltage Rb. This interval may not correspond to an overlapped interval between the distributions ST1 and ST2. Accordingly, no errors may arise.

In case of sub-distributions SST1' and SST2' experiencing higher coupling influence from aggressor cells, data may be judged according to a reference corresponding to a distance (da=d2) of the coupling. According to example embodiments, in case of memory cells included in the sub-distributions SST1' and SST2', memory cells having threshold voltages higher than a read voltage Ra may be judged to correspond to logic '0', and memory cells having threshold voltages lower than a read voltage Ra may be judged to correspond to logic '1'. In the event that division is made by the sub-distributions SST1' and SST2', no memory cells may exist between a read voltage Ra and a read voltage Rb'. This interval may not correspond to an overlapped interval between the distributions ST1 and ST2. This may indicate that no error arises.

Figure 16:
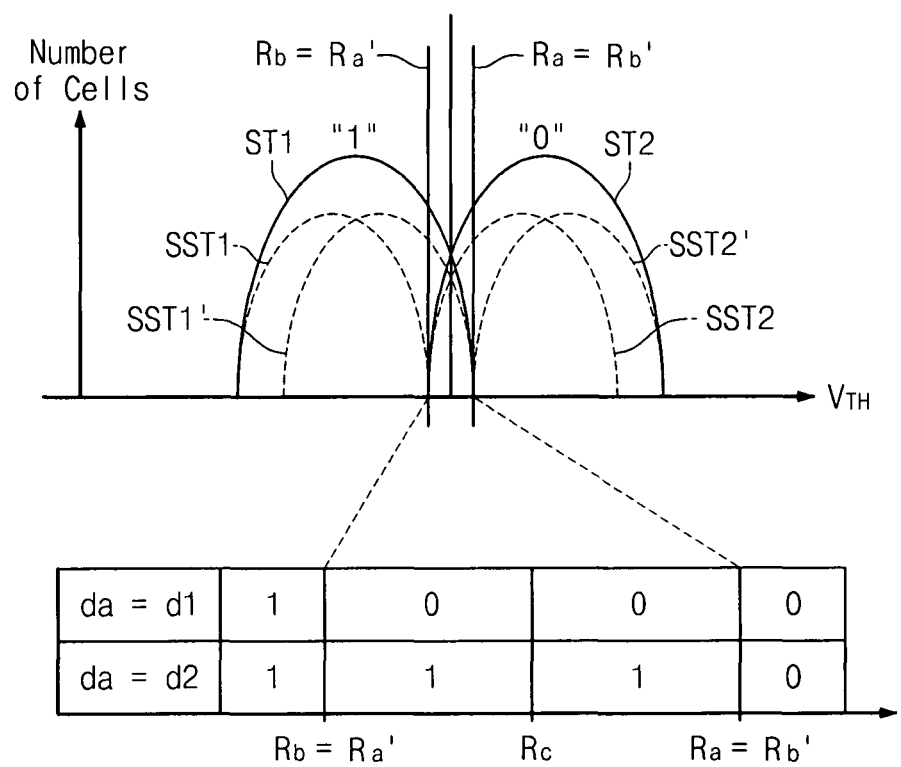

FIG. 16 is a diagram showing a read method which may be used in a case where sub-distributions SST1' and SST2 are overlapped partially. FIG. 16 illustrates a read method which may be used in the event that a lower limit voltage Rb of the sub-distribution SST2 is identical to an upper limit voltage Ra' of the sub-distribution SST1' and that a lower limit voltage Rb' of the sub-distribution SST2' is identical to an upper limit voltage Ra of the sub-distribution SST1'.

If distributions are judged to be overlapped as illustrated in FIG. 16 according to an analysis result for aggressor cells, a fine or interval read operation may be performed in which read voltages Ra'=Rb and Ra=Rb' are used. In case of sub-distributions SST1 and SST2 experiencing less coupling influence from aggressor cells, data may be judged according to a reference corresponding to a distance (da=d1) of the coupling. According to example embodiments, in case of memory cells included in the sub-distributions SST1 and SST2, memory cells having threshold voltages higher than a read voltage Rb=Ra' may be judged to correspond to logic '0', and memory cells having threshold voltages lower than a read voltage Rb=Ra' may be judged to correspond to logic '1'.

In case of sub-distributions SST1' and SST2' experiencing higher coupling influence from aggressor cells, data may be judged according to a reference corresponding to a distance (da=d2) of the coupling. According to example embodiments, in case of memory cells included in the sub-distributions SST1' and SST2', memory cells having threshold voltages higher than a read voltage Ra=Rb' may be judged to correspond to logic '0', and memory cells having threshold voltages lower than a read voltage Ra=Rb' may be judged to correspond to logic '1'.

Figure 17:
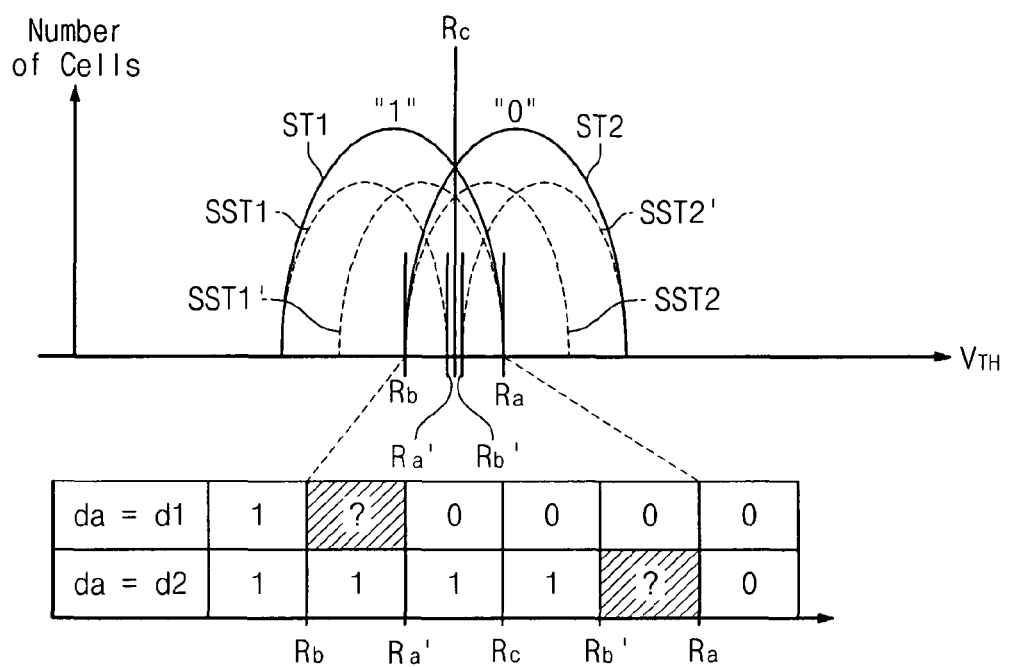

FIG. 17 is a diagram showing a read method in a case where sub-distributions SST1 and SST2 are overlapped partially. FIG. 17 illustrates a read method which may be used in the event that a lower limit voltage Rb of the sub-distribution SST2 is lower than an upper limit voltage Ra' of the sub-distribution SST1 and that a lower limit voltage Rb' of the sub-distribution SST2' is higher than an upper limit voltage Ra' of the sub-distribution SST1.

If distributions are judged to be overlapped as illustrated in FIG. 17 according to an analysis result for aggressor cells, a fine or interval read operation may be performed in which read voltages Rb, Ra', Rb', and Ra are used. In case of sub-distributions SST1 and SST2 experiencing lower coupling influence from aggressor cells, data may be judged according to a reference corresponding to a distance (da=d1) of the coupling. According to example embodiments, in case of memory cells included in the sub-distributions SST1 and SST2, memory cells having threshold voltages higher than a read voltage Ra' may be judged to correspond to logic '0', and memory cells having threshold voltages lower than a read voltage Rb' may be judged to correspond to logic '1'. However, in a case where data is judged based on a reference corresponding to a distance (da=d1) of the coupling, it may be difficult to determine data of memory cells between the read voltages Rb' and Ra'. This case may be addressed using an ECC scheme or an erasure decoding scheme. As will be described later, it may be possible to determine data of memory cells at an ambiguous region via a fine read operation.

In case of sub-distributions SST1' and SST2' experiencing higher coupling influence from aggressor cells, data may be judged according to a reference corresponding to a distance (da=d2) of the coupling. According to example embodiments, if memory cells are included in the sub-distributions SST1' and SST2', memory cells having threshold voltages higher than a read voltage Ra may be judged to correspond to logic '0', and memory cells having threshold voltages lower than a read voltage Rb' may be judged to correspond to logic '1'. However, if data is judged based on a reference corresponding to a distance (da=d2) of the coupling, it may be difficult to determine data of memory cells between the read voltages Rb' and Ra. This case may be solved via an ECC scheme or an erasure decoding scheme. As will be described later, it may be possible to determine data of memory cells at an ambiguous region via a fine read operation.

Figure 18:
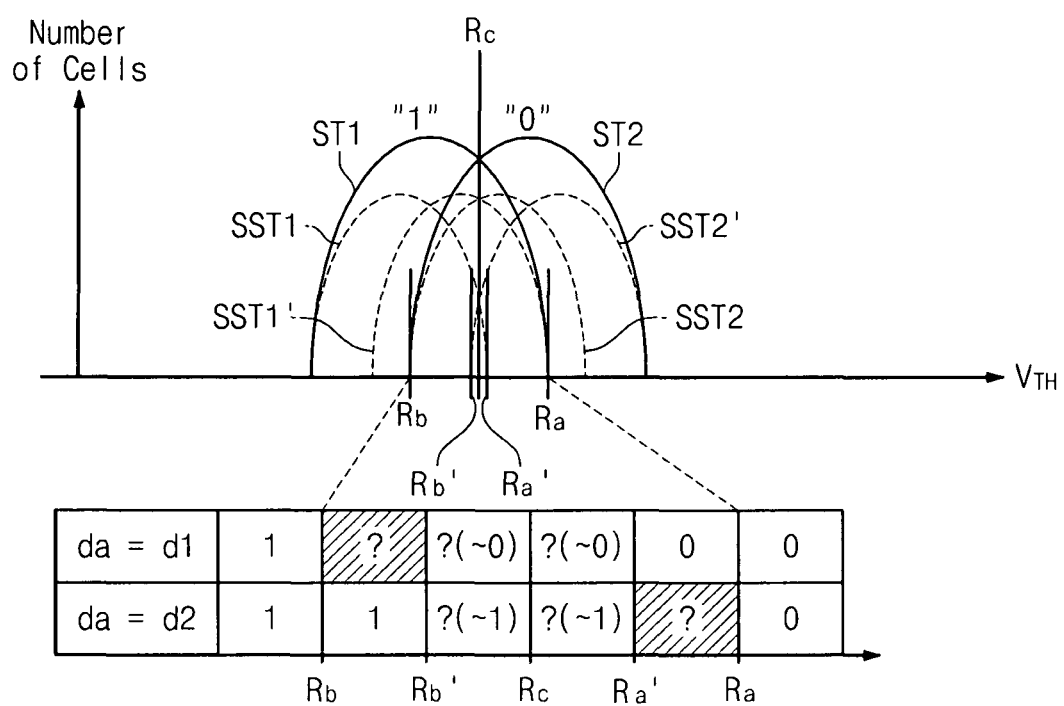

FIG. 18 is a diagram showing a read method which may be used in a case where sub-distributions SST1 and SST2' are overlapped partially. FIG. 18 illustrates a read method in the event that a lower limit voltage Rb of the sub-distribution SST2 and a lower limit voltage Rb' of the sub-distribution SST2' are lower than an upper limit voltage Ra' of the sub-distribution SST1.

If distributions are judged to overlap one another as illustrated in FIG. 18 according to an analysis result for aggressor cells, a fine or interval read operation may be performed in which read voltages Rb, Rb', and Ra are used. In case of sub-distributions SST1 and SST2 experiencing lower coupling influence from aggressor cells, data may be judged according to a reference corresponding to a distance (da=d1) of the coupling. According to example embodiments, if memory cells are included in the sub-distributions SST1 and SST2, memory cells having threshold voltages higher than a read voltage Ra' may be judged to correspond to logic '0', and memory cells having threshold voltages lower than a read voltage Rb may be judged to correspond to logic '1'.

However, if data is judged based on a reference corresponding to a distance (da=d1) of the coupling, it may be difficult to determine data of memory cells between the read voltages Rb and Rb'. Further, it may be difficult to determine data of memory cells between the read voltages Rb' and Ra. Since threshold voltages of memory cells between the read voltages Rb' and Ra' may be closer to logic '0', data of the memory cells may be judged to be logic '0'. Memory cells between the read voltages Rb and Rb' may be handled using an ECC scheme or an erasure decoding scheme. Alternatively, memory cells between the read voltages Rb and Ra' may be handled using an ECC scheme or an erasure decoding scheme. As will be described later, it may be possible to determine data of memory cells at an ambiguous region via a fine read operation.

For sub-distributions SST1' and SST2' experiencing higher coupling influence from aggressor cells, data may be judged according to a reference corresponding to a distance (da=d2) of the coupling. According to example embodiments, for memory cells included in the sub-distributions SST1' and SST2', memory cells having threshold voltages higher than a read voltage Ra may be judged to correspond to logic '0', and memory cells having threshold voltages lower than a read voltage Rb' are judged to correspond to logic '1'.

However, if data is judged based on a reference corresponding to a distance (da=d1) of the coupling, it may be difficult to determine data of memory cells between the read voltages Rb' and Ra. Further, it may be difficult to determine data of memory cells between the read voltages Rb' and Ra. Since threshold voltages of memory cells between the read voltages Rb' and Ra' may be closer to logic '1', data of the memory cells may be judged to be logic '1'. Memory cells between the read voltages Ra' and Ra may be handled using an ECC scheme or an erasure decoding scheme. Alternatively, memory cells between the read voltages Rb and Ra may be handled using an ECC scheme or an erasure decoding scheme. As will be described later, it may be possible to determine data of memory cells at an ambiguous region via a fine read operation.

Figure 19:
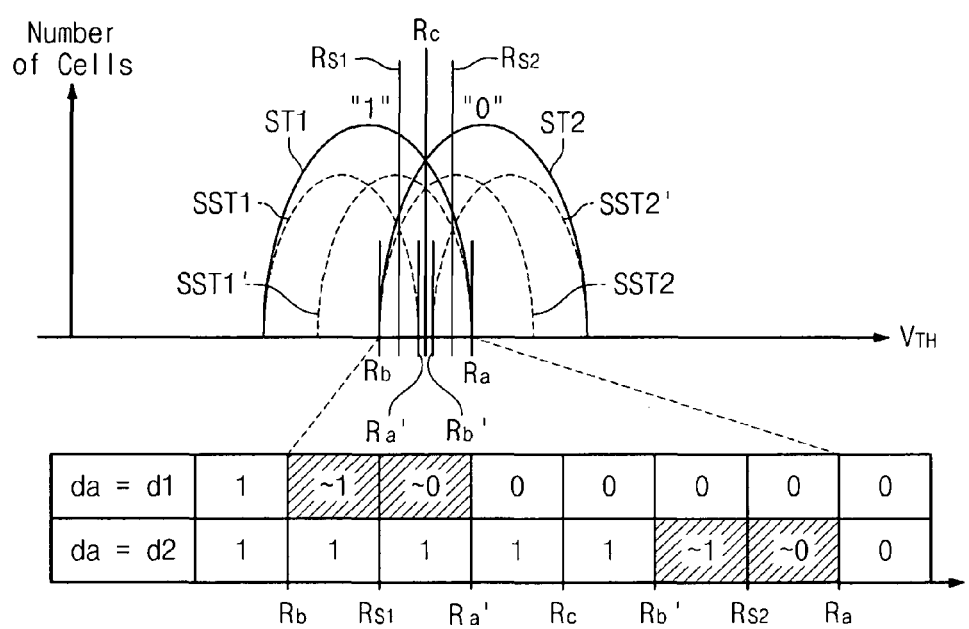
FIG. 19 is a diagram for describing a read method for addressing problems in the read method illustrated in FIG. 17.

FIG. 19 is a diagram for describing a read method for addressing problems in FIG. 17. FIG. 19 illustrates a read method which may be used in the event that a lower limit voltage Rb of the sub-distribution SST2 is lower than an upper limit voltage Ra' of the sub-distribution SST1 and a lower limit voltage Rb' of the sub-distribution SST2' is higher than an upper limit voltage Ra' of the sub-distribution SST1.

If distributions are judged to overlap one another as illustrated in FIG. 19 according to an analysis result for aggressor cells, a fine or interval read operation may be performed in which read voltages Rb, Rs1, Ra', Rb', Rs2, and Ra are used. According to example embodiments, the read voltages Rs1 and Rs2 may be voltages used for exact judgment of an overlapped region difficult to decide data.

For sub-distributions SST1 and SST2 experiencing lower coupling influence from aggressor cells, data may be judged according to a reference corresponding to a distance (da=d1) of the coupling, as a result of the fine read operation. According to example embodiments, for memory cells included in the sub-distributions SST1 and SST2, memory cells having threshold voltages higher than a read voltage Ra' may be judged to correspond to logic '0', and memory cells having threshold voltages lower than a read voltage Rb may be judged to correspond to logic '1'. Further, it may be possible to decide data of memory cells between the read voltages Rb and Ra'. When data is judged based on a reference corresponding to a distance (da=d1) of the coupling, memory cells having threshold voltages higher than a read voltage Rb and lower than a read voltage Rs1 may be judged to correspond to logic '1', and memory cells having threshold voltages higher than a read voltage Rs1 and lower than a read voltage Ra' may be judged to correspond to logic '0'.

For sub-distributions SST1' and SST2' experiencing higher coupling influence from aggressor cells, data may be judged according to a reference corresponding to a distance (da=d2) of the coupling. According to example embodiments, for memory cells included in the sub-distributions SST1' and SST2', memory cells having threshold voltages higher than a read voltage Ra may be judged to correspond to logic '0', and memory cells having threshold voltages lower than a read voltage Rb' may be judged to correspond to logic '1'. Further, it may be possible to decide data of memory cells between the read voltages Rb' and Ra. When data is judged based on a reference corresponding to a distance (da=d1) of the coupling, memory cells having threshold voltages higher than a read voltage Rb' and lower than a read voltage Rs2 may be judged to correspond to logic '1', and memory cells having threshold voltages higher than a read voltage Rs2 and lower than a read voltage Ra may be judged to correspond to logic '0'.

As described above, an ambiguous region may be processed by the two additional read operations without the ECC block or an erasure decoding scheme.

Figure 20:
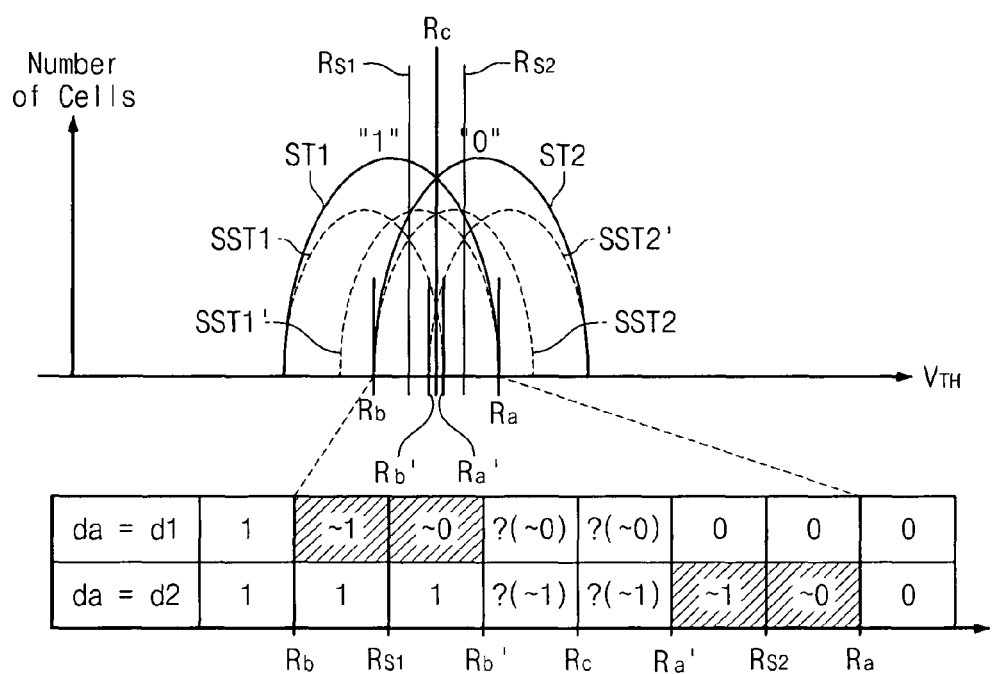
FIG. 20 is a diagram for describing a read method for addressing problems in the read method illustrated in FIG. 18.

FIG. 20 is a diagram for describing a read method for addressing problems in FIG. 18. Referring to FIG. 20, if distributions are judged to be overlapped as illustrated in FIG. 20 according to an analysis result for aggressor cells, a fine or interval read operation may be performed in which read voltages Rb, Rs1, Rb', Ra', Rs2, and Ra are used. According to example embodiments, the read voltages Rs1 and Rs2 may be voltages used for exact judgment of an overlapped region where it may be difficult to decide data.

For sub-distributions SST1 and SST2 experiencing lower coupling influence from aggressor cells, data may be judged according to a reference corresponding to a distance (da=d1) of the coupling, as a result of the fine read operation. According to example embodiments, for memory cells included in the sub-distributions SST1 and SST2, memory cells having threshold voltages higher than a read voltage Rb' may be judged to correspond to logic '0', and memory cells having threshold voltages lower than a read voltage Rb may be judged to correspond to logic '1'. Further, it may be possible to decide data of memory cells between the read voltages Rb and Rb'. According to example embodiments, when data is judged based on a reference corresponding to a distance (da=d1) of the coupling, memory cells having threshold voltages higher than a read voltage Rb and lower than a read voltage Rs1 may be judged to correspond to logic '1', and memory cells having threshold voltages higher than a read voltage Rs1 and lower than a read voltage Rb' may be judged to correspond to logic '0'.

For sub-distributions SST1' and SST2' experiencing higher coupling influence from aggressor cells, data may be judged according to a reference corresponding to a distance (da=d2) of the coupling. According to example embodiments, for memory cells included in the sub-distributions SST1' and SST2', memory cells having threshold voltages higher than a read voltage Ra may be judged to correspond to logic '0', and memory cells having threshold voltages lower than a read voltage Ra' may be judged to correspond to logic '1'. Further, it may be possible to decide data of memory cells between the read voltages Ra' and Ra. Memory cells having threshold voltages higher than a read voltage Ra' and lower than a read voltage Rs2 may be judged to correspond to logic '1', and memory cells having threshold voltages higher than a read voltage Rs2 and lower than a read voltage Ra may be judged to correspond to logic '0'.

For the fine read operation for compensating the above-described coupling effect, it may be possible to use the Likelihood Ratio (LR) or Log Likelihood Ratio (LLR) with respect to the main distribution or the sub-distribution. The LR or LLR may be applied to an ECC block or filter using a read voltage based on a read operation and given probability.

Discussion of example embodiments above includes descriptions of a fine read operation which may be capable of judging data of memory cells exactly, or with a higher degree of accuracy, by sampling using more read voltages. For ease of description, used distributions are illustrated as if they are symmetric. However, the illustrated distribution shapes and intervals between distributions are provided as examples. Usage of a practical algorithm may not result in symmetric distribution shapes. However, it is well understood that example embodiments may be applied to non symmetrical distribution shapes. In practice, the number of read voltages used at a fine read operation may be determined so as not to lower read performance.

Figure 21:
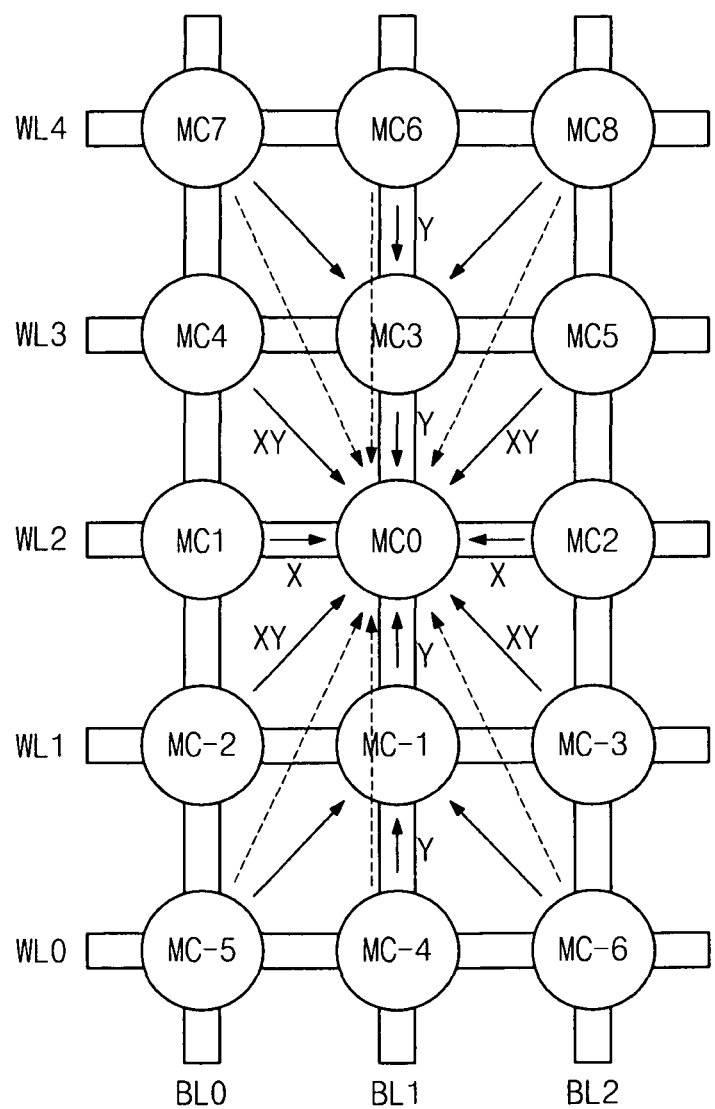
FIG. 21 is a diagram illustrating various types of aggressor cells.

FIG. 21 is a diagram showing various types of aggressor cells. In FIG. 1, adjacent aggressor cells are considered to describe retention influence, for example, the coupling or charge loss according to a time lapse at a program operation. However, if memory cells MC6, MC7, MC8, MC-4, MC-5, and MC-6 not adjacent to a memory cell MC0 are considered as an aggressor cell, more fine decision may be made. In the example provided in FIG. 21, non-adjacent aggressor cells are illustrated as being in non-adjacent word lines. However, example embodiments are not limited to this disclosure. According to example embodiments, for distribution division of the higher resolution, non-adjacent aggressor cells may also be in non-adjacent bit lines.

Figure 22:
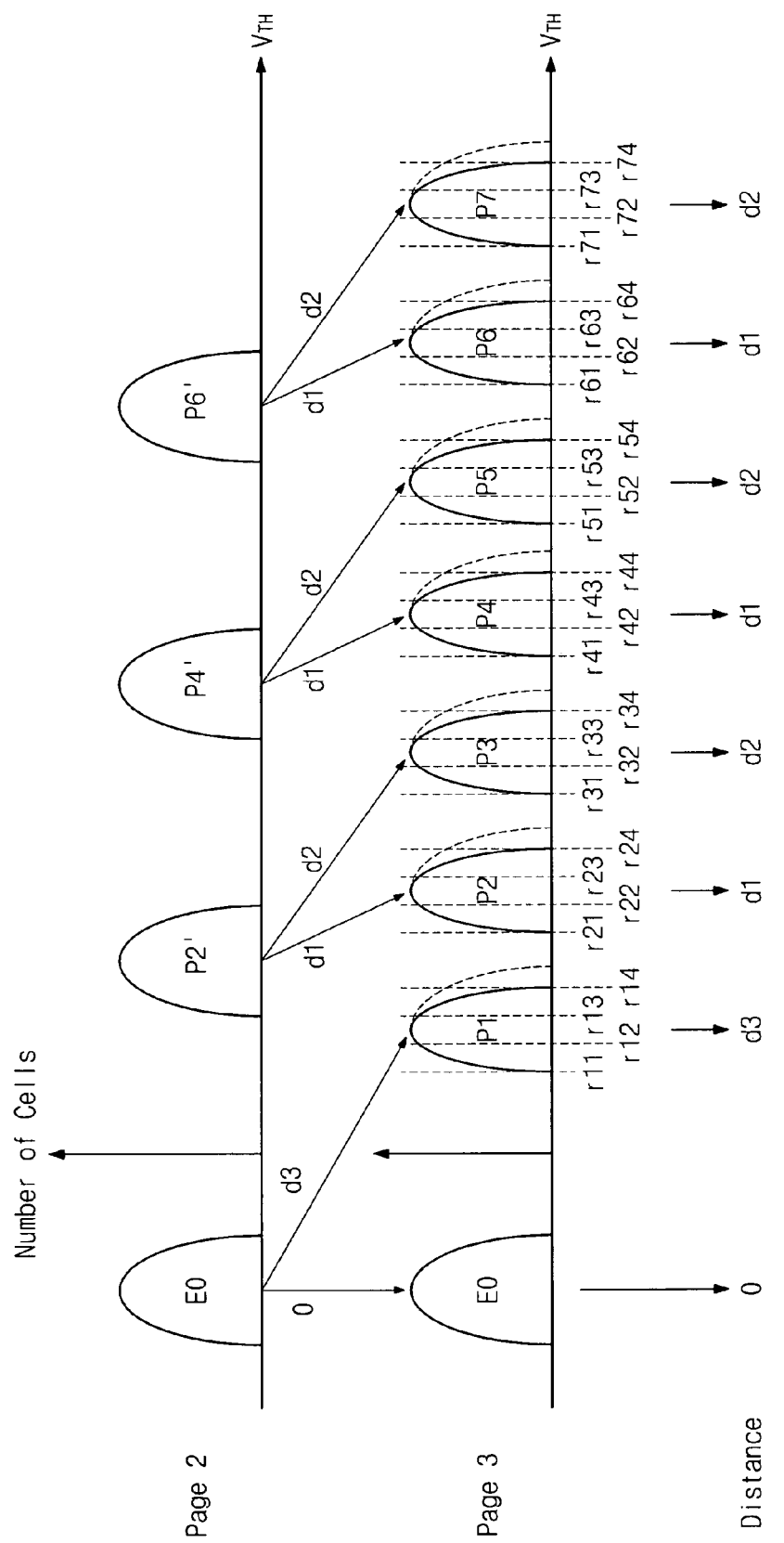
FIG. 22 is a diagram illustrating a method for classifying physical influences of aggressor cells according to example embodiments.

FIG. 22 is a diagram showing a method for classifying physical influences of aggressor cells according to example embodiments. FIG. 22 illustrates a method of finely analyzing aggressor cells on a threshold voltage distribution. In particular, FIG. 22 illustrates that the third page is programmed at aggressor cells in which the second page is programmed.

Distributions E0, P2', P4', and P6' may indicate aggressor cells in which the second page is programmed. However, aggressor cells corresponding to the distribution E0 may be programmed to any one of two distributions E0 and P1 according to programming of the third page. Among aggressor cells corresponding to the distribution E0, program-inhibited memory cells may be maintained at the distribution E0. A coupling distance of aggressor cells maintaining the distribution E0 may be classified into 0. Among aggressor cells corresponding to the distribution E0, memory cells to be programmed to a distribution P1 may be classified into a coupling distance d3. The coupling distance d3 may indicate that the most influence is inflicted on a victim cell when an aggressor cell is programmed from an erase state E0 to a program state P1. However, the distances d2 and d3 may be classified the same according to a division policy. When classification of the coupling distance is made, it may be possible to assign the coupling distances d1 and d2 and the coupling distance d3 to one coupling distance group. Alternatively, it may be possible to assign the coupling distances 0, d1 and d2 and the coupling distance d3 to one coupling distance group because the coupling distance d3 is relatively large in size.

Threshold voltages of aggressor cells corresponding to the distribution P2' may be shifted to any one of two distributions P2 and P3 according to programming of the third page. Aggressor cells shifted from the distribution P2' to the distribution P2 may be classified into a coupling distance d1, and aggressor cells shifted from the distribution P2' to the distribution P3 may be classified into a coupling distance d2. Threshold voltages of aggressor cells corresponding to the distribution P4' may be shifted to any one of two distributions P4 and P5 according to programming of the third page. Aggressor cells shifted from the distribution P4' to the distribution P4 may be classified into a coupling distance d1, and aggressor cells shifted from the distribution P4' to the distribution P5 may be classified into a coupling distance d2. Threshold voltages of aggressor cells corresponding to the distribution P6' may be shifted to any one of two distributions P6 and P7 according to programming of the third page. Aggressor cells shifted from the distribution P6' to the distribution P6 may be classified into a coupling distance d1, and aggressor cells shifted from the distribution P6' to the distribution P7 may be classified into a coupling distance d2.

However, it may be possible to classify the coupling distances d1 and d2 according to a division policy.

As described above, a coupling distance may be judged by using only data of aggressor cells. However, in addition to data of aggressor cells, a fine read operation for aggressor cells may be further performed to classify the coupling in a fine manner. For example, a coupling distance inflicted to a victim cell from aggressor cells may be divided finely by performing a fine read operation using interval read voltages r11, r12, r13, and r14 for each distribution P1 of aggressor cells to which the third page is programmed. An additional read operation for such aggressor cells may be performed with respect to each of remaining distributions P2 to P7.

Figure 23A:
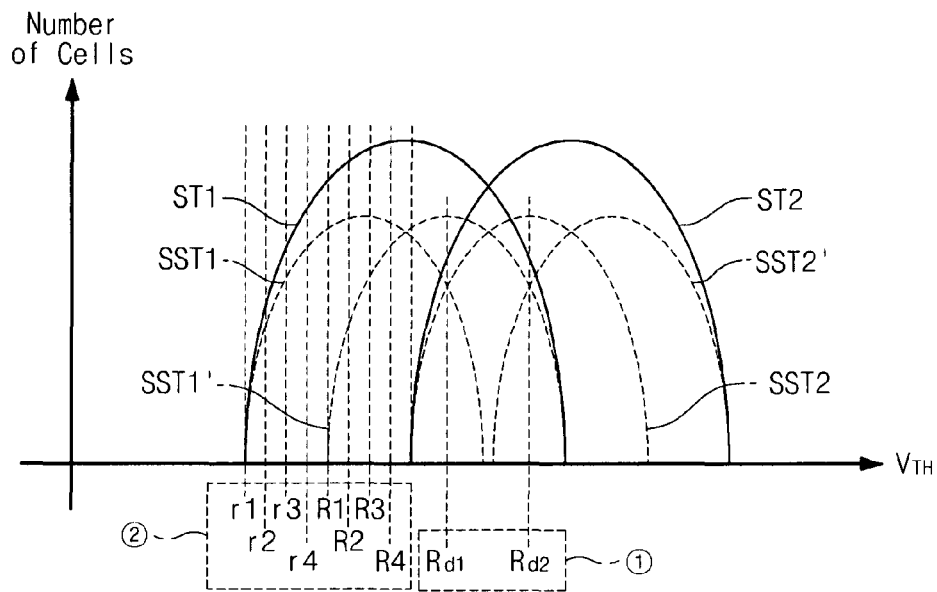
FIGS. 23A and 23B are diagrams illustrating other methods for finely classifying physical influences of aggressor cells according to example embodiments.
Figure 23B:
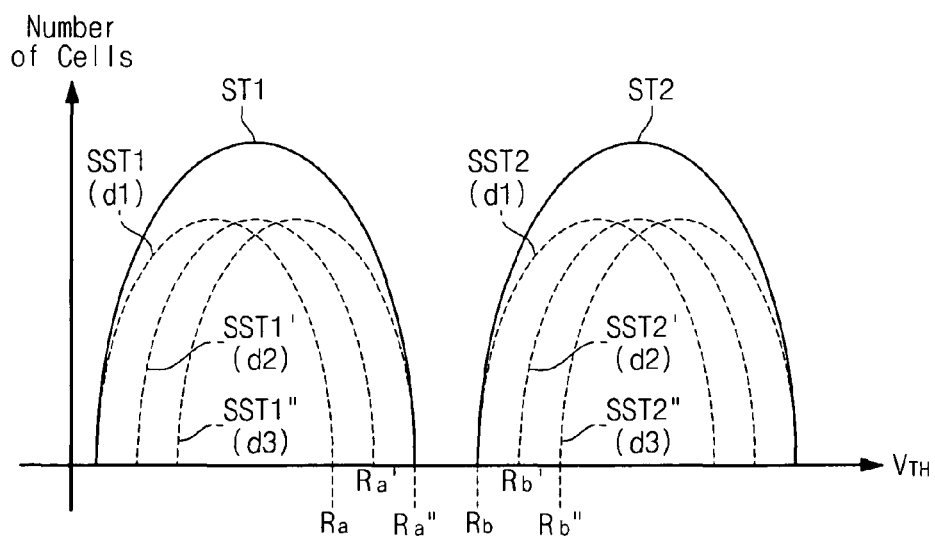

FIGS. 23A and 23B are diagrams showing other methods for finely classifying physical influences of aggressor cells according to example embodiments.

FIG. 23A illustrates sub-distributions SST1, SST1', SST2, and SST2' classified based on coupling distances 0, d1, and d2 which aggressor cells inflict to victim cells. A voltage for distinguishing sub-distributions (SST1, SST2; and SST1', SST2') of victim cells which are estimated according to one of coupling distances 0 and d1, or a coupling distance d2 due to corresponding aggressor cells may be selected.

Read voltages Rd1 and Rd2 for distinguishing sub-distributions may be selected according to characteristics of sub-distributions extracted by analyzing aggressor cells. This characteristic is marked by a number ①. The read voltage Rd1 for distinguishing sub-distributions SST1 and SST2 corresponding to the coupling distance d1 may be calculated based on the coupling distances 0, d1, and d2. In accordance with the read voltage Rd1, it may be possible to distinguish the sub-distributions SST1 and SST2 even at a region where the distributions ST1 and ST2 are overlapped. This means that errors may be reduced. The read voltage Rd2 for distinguishing sub-distributions SST1' and SST2' corresponding to the coupling distance d2 may be calculated based on the coupling distances 0, d1, and d2. In accordance with the read voltage Rd2, it may be possible to distinguish the sub-distributions SST1' and SST2' even at a region where the distributions ST1 and ST2 overlap each other. Accordingly, errors may be reduced. According to example embodiments, it may be possible to classify sub-distributions of victim cells and select a desired or optimum read voltage for distinguishing the classified sub-distributions.

Read voltages marked by a number ② may be read voltages r1, r2, r3, r4, R1, R2, R3, and R4 corresponding to sub-distributions SST1 and SST1' subdivided by a fine read operation for aggressor cells described in FIG. 17. Sub-distributions SST1 and SST1' corresponding to one distribution ST1 may be defined by a fine boundary value via subdivision of the coupling influence. The sub-distribution SST1 may be judged to have a read voltage r1 as a boundary value, via the fine read operation for aggressor cells. Alternatively, the sub-distribution SST1 may be judged to have one of read voltages r2, r3, and r4 as a boundary value, via the fine read operation for aggressor cells. Accordingly, the coupling distances 0, d1, and d2 may be subdivided by the fine read operation for aggressor cells. Subdivision of the coupling distances may include selecting one of the read voltages R1, R2, R3, and R4 as a voltage for distinguishing the sub-distribution SST1' when the subdivision of the coupling distances is applied to the sub-distribution SST1'. Although not illustrated in figures, it may be possible to apply the fine read operation for aggressor cells to adjustment of boundary values. Adjustment of boundary values via the fine read operation may be performed with respect to each of the sub-distributions.

In FIG. 23B, illustrates sub-distributions SST1, SST1', SST1", SST2, SST2', and SST2" divided according to coupling distances 0, d1, d2, and d3 by which victim cells are affected from aggressor cells. A voltage may be selected for distinguishing sub-distributions (SST1, SST2; SST1', SST2'; and SST1", SST2") of victim cells predicted according to coupling distances d1, d2, and d3 due to aggressor cells. Voltages Ra, Ra', Ra", Rb, Rb', and Rb" may be defined by boundary values for sub-distributions. FIG. 23B illustrates the case where one distribution ST1 is divided into three sub-distributions. However, example embodiments are not limited to this disclosure. According to example embodiments, one distribution may be divided into four or more sub-distributions according to a coupling distance do of aggressor cells.

Example embodiments were described under the condition that coupling distances inflicted by aggressor cells may be 0, d1, d2, and d3. However, according to example embodiments, coupling distances may be set up differently according to various program methods. For example, a coupling distance may be divided into 0, d1, d2, d3, d4, d5, d6, and d7 in the event that one state of a (i−1)th page is programmed to four states at an ith page. Coupling distances 0, d5, d6, and d7 may be generated when cells are programmed to four states including an erase state of the ith page from an erase state of the (i−1)th page. Further, coupling distances d1, d2, d3, and d4 may be generated as cells are programmed to four states of the ith page from any one program state excepting an erase state of the (i−1)th page. Distributions may be divided by grouping these coupling distances by a two or three unit. Likewise, a manner of grouping similar distances may be applied to variations due to disturbance, charge loss, lateral charge spreading, and the like.

Figure 24:
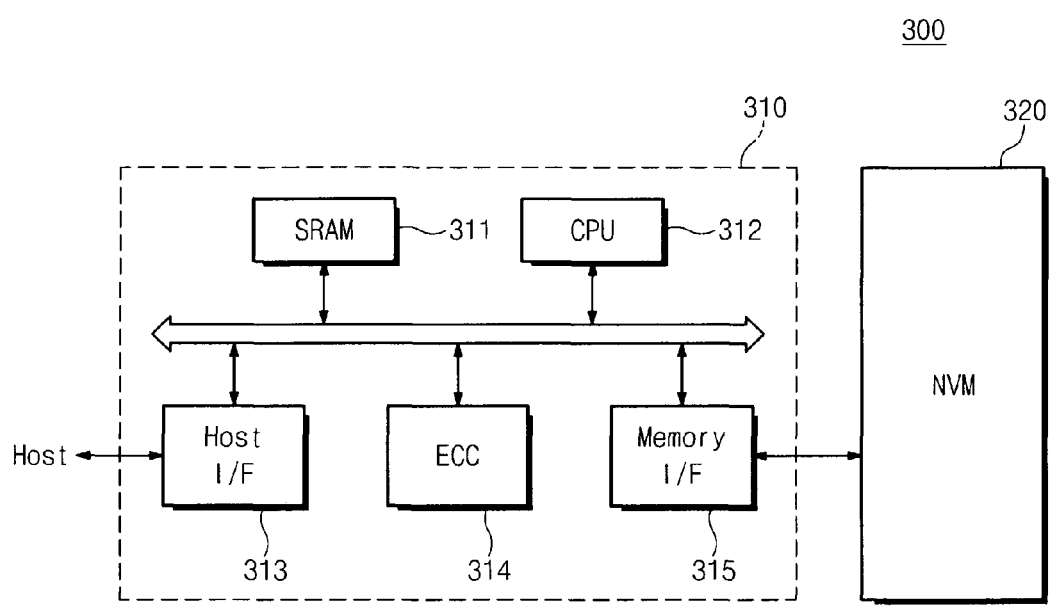
FIG. 24 is a block diagram illustrating a memory system according to example embodiments.

FIG. 24 is a block diagram showing a memory system according to example embodiments. Referring to FIG. 24, a memory system 300 according to example embodiments may include a non-volatile memory device 320 and a memory controller 310.

The non-volatile memory device 320 may be formed of a flash memory device which has a cell array 100 illustrated in FIG. 1. The memory controller 310 may be configured to control the non-volatile memory device 320. The non-volatile memory device 320 and the memory controller 320 may be configured to form a memory card or a Solid State Drive/Disk (SSD). SRAM 311 may be used as a work memory of a processing unit 312. The host interface 313 may include the data exchange protocol of a host which is connected with the memory system 300. An ECC block 314 may be configured to detect and correct errors of data read out from the non-volatile memory device 320. A memory interface 314 may be configured to interface with the non-volatile memory device 320 according to example embodiments. The processing unit 312 may perform an overall control operation for data exchange of the memory controller 310. Although not shown in figures, the memory system 300 according to example embodiments may further include ROM which stores code data for interfacing with the host. The non-volatile memory device 320 may be formed of a multi-chip package which includes a plurality of flash memory chips. The memory system 300 may be used as the storage media which has a low error rate and a high reliability. In particular, a flash memory device according to example embodiments may be provided to a memory system, for example, the SSD. Accordingly, the memory controller 310 may be configured to communicate with an external device (for example, a host) via one of interface protocols including, for example, a parallel AT Attachment ATA (PATA), serial STA (SATA), Universal Serial Bus (USB), Small Computer System Interface (SCSI), Serial Attached SCSI (SAS), PCI-Express, Enhanced Small Disk Interface (ESDI), or/and Integrated Device Electronics (IDE).

According to example embodiments, the memory controller 310 may access the non-volatile memory device 320 in the same manner as described above. According to example embodiments, a verification voltage for victim cells may be selected by acquiring data for aggressor cells at a program operation. At a read operation, victim cells may be divided according to coupling distances based on data for aggressor cells, and a desired or optimum read level may be selected to distinguish the divided sub-distributions, respectively. Further, it may be possible to decide a desired or optimum read level according to a fine read method for reducing error probability. According to example embodiments, the memory controller 310 may be provided with characteristics extracted from, for example, process parameters, disturbance, retention, program/erase cycle, and pilot cells, in order to estimate coupling or retention characteristics more finely. Additionally, it may be possible to achieve objects of example embodiments by providing latches or flip-flops for storing information associated with aggressor cells in the memory device 320. If information associated with aggressor cells is stored, it may be possible to revise read information for aggressor cells and output the revised read information. Alternatively, the distribution division phenomenon of memory cells may be solved via controlling of a bit line voltage. According to example embodiments, sub-distributions of victim cells may be divided based on aggressor cells as is discussed with reference to FIGS. 23A and 23B. If sub-distributions of victim cells may be divided based on aggressor cells, a distribution of victim cells may be divided into sub-distributions based on data acquired from aggressor cells by the memory controller 310, and a read method, a program method, or the read and program methods may be made according to the divided sub-distributions including victim cells. The aforementioned functions are described as being controlled by the memory controller 310. However, example embodiments are not limited to this disclosure. For example, the non-volatile memory device 320 may be configured such that the above-described functions are executed. According to example embodiments, if analyzing sub-distributions including selected memory cells is completed based on data of aggressor cells, the non-volatile memory device 320 may be configured to compensate the influence of aggressor cells due to coupling or charge loss by adjusting a word line voltage or controlling a bit line pre-charge voltage.

Further, the physical influences according to the coupling or charge loss may not be fixed to predetermined values. The physical influences may differ according to a program/erase cycle number or a lapse of a programmed time. The physical influence due to aggressor cells may be estimated based such influences.

Figure 25:
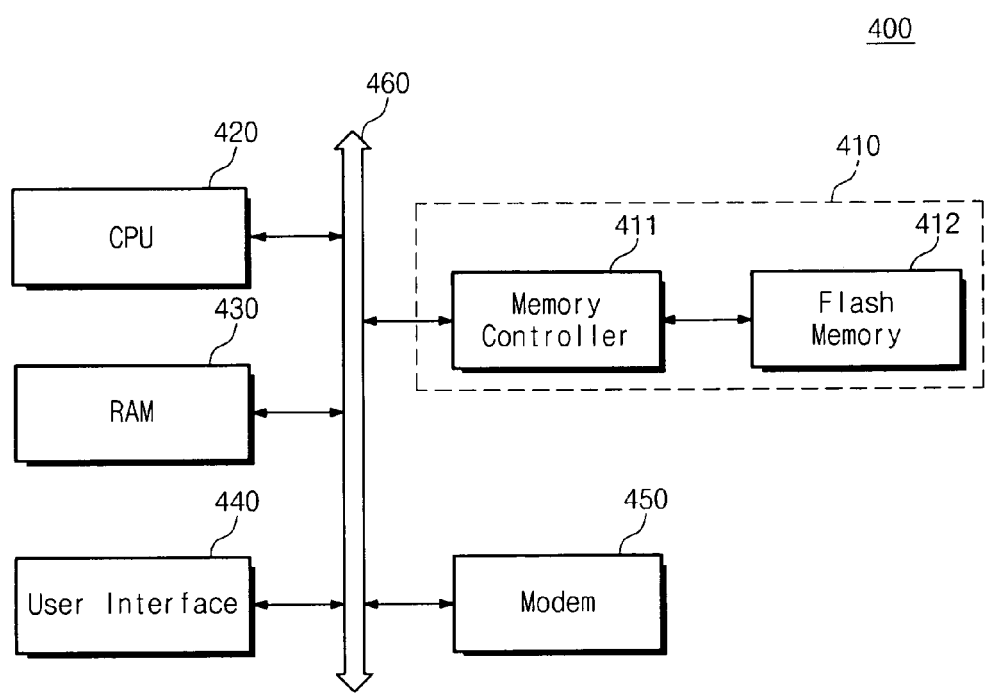
FIG. 25 is a block diagram illustrating a computing system according to example embodiments.

FIG. 25 is a block diagram showing a computing system according to example embodiments. A computing system 400 according to example embodiments may include a microprocessor 420, RAM 430, a user interface 440, a modem 450, which may be, for example, a basedband chipset, and a memory system 410.

The memory system 410 may be configured to operate in the same discussed above with reference to FIG. 19. In the event that the computing system 400 is a mobile device, the computing system 400 may further comprise a battery for supplying an operating voltage of the computing system 400. Although not illustrated in figures, the computing system 400 may further comprise an application chipset, a camera image processor, mobile DRAM, and the like.

The memory system 410, for example, may be formed of SSD which uses non-volatile memories to store data. Alternatively, the memory system 410 may be formed of fusion flash memories (for example, One_NAND flash memories). The computing system 400 according to example embodiments may provide reliable data to the memory system 410 by analyzing of distribution characteristics for victim cells based on data of aggressor cells and distribution division according to distances of the threshold voltage shift influence, for example, the coupling.

The analyzing of distribution characteristics and the distribution division may be made at the memory system 410 or according to the control of the microprocessor 420 of the computing system 400. Alternatively, for effective resource application, the memory system 410 and the microprocessor 420 may share the analyzing of distribution characteristics and the distribution division.

A flash memory device and/or a memory controller according to example embodiments may be packed by various types of packages. For example, the flash memory device and/or the memory controller according to example embodiments may be packed by one selected from a group of PoP(Package on Package), Ball grid arrays(BGAs), Chip scale packages(CSPs), Plastic Leaded Chip Carrier(PLCC), Plastic Dual In-Line Package(PDIP), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP), and the like.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. An access method of a non-volatile memory device comprising:
    detecting a threshold voltage variation of a first memory cell based on first data to be programmed in the first memory cell, the threshold voltage variation of the first memory cell being capable of physically affecting a second memory cell;
    assigning the second memory cell to a sub-distribution selected from among a plurality of sub-distributions according to a distance of the threshold voltage variation of the first memory cell, the plurality of sub-distributions corresponding to a target distribution of the second memory cell, at least one of the plurality of sub-distributions having a threshold voltage range that is not entirely within a threshold voltage range of the target distribution;
    programming the second memory cell; and
    programming the first data in the first memory cell;
    wherein a verification voltage for programming the second memory cell is selected to be identical to or lower than a verification voltage corresponding to the target distribution of the second memory cell, and
    wherein the programming of the second memory cell takes place after assigning the second memory cell to the selected sub-distribution and before programming the first data in the first memory cell.

2. The access method of claim 1, wherein the threshold voltage variation of the first memory cell is detected by reading the first memory cell.

3. The access method of claim 2, wherein the first memory cell is read using a plurality of different read voltages each corresponding to one threshold voltage distribution.

4. The access method of claim 1, wherein the detecting includes estimating the threshold voltage variation of the first memory cell based on data to be programmed in the first memory cell.

5. The access method of claim 1, further comprising:
    selecting a read voltage, from among a plurality of read voltages, corresponding to the selected sub-distribution; and
    reading the second memory cell using the selected read voltage,
    wherein the selected read voltage distinguishes the selected sub-distribution from remaining sub-distributions of the plurality of sub-distributions.

6. The access method of claim 5, wherein each of the plurality of read voltages has different values, and each of the plurality of read voltages corresponds to each of the plurality of sub-distributions, respectively.

7. The access method of claim 1, wherein the verification voltage for programming the second memory cell is selected so that, after the first memory cell is programmed, the second memory cell has a threshold voltage corresponding to the target distribution.

8. An access method of a non-volatile memory device comprising:
    detecting a threshold voltage variation of a first memory cell based on first data to be programmed into the first memory cell, the threshold voltage variation of the first memory cell being capable of physically affecting a second memory cell;
    assigning the second memory cell to a sub-distribution selected from among a plurality of sub-distributions according to a distance of the threshold voltage variation of the first memory cell, the plurality of sub-distributions corresponding to a target distribution of the second memory cell, the assigning taking place before the first data is programmed into the first cell; and executing a program operation, the program operation including adjusting a verification voltage of the second memory cell based on the assigned sub-distribution and programming the second memory cell using the adjusted verification voltage.

9. The access method of claim 1, further comprising:

executing one of a read operation and a program operation, the read operation including adjusting a read voltage of the second memory cell based on the plurality of sub-distributions and a level of the target distribution of the second memory cell, and the program operation including adjusting a verification voltage of the second memory cell based on the plurality of sub-distributions and a level of the target distribution of the second memory cell.

10. An access method of a non-volatile memory device comprising:

detecting a threshold voltage variation of a first memory cell based on first data to be programmed in the first memory cell, the threshold voltage variation of the first memory cell being capable of physically affecting a second memory cell;

assigning the second memory cell to a sub-distribution selected from among a plurality of sub-distributions according to a distance of the threshold voltage variation of the first memory cell, the plurality of sub-distributions corresponding to a target distribution of the second memory cell; and providing a program parameter corresponding to the selected sub-distribution to program the second memory cell before programming the first data into the first memory cell, the provided program parameter being based on the detected threshold voltage variation of the first memory cell, wherein the detecting and the assigning are executed at an initial read operation for storing multi-bit data in the second memory cell.

11. The access method of claim 1, wherein the threshold voltage variation of the first memory cell is capable of physically affecting the second memory cell due to one of a coupling effect experienced by the second memory cell as a result of the first memory cell, a threshold voltage variation experienced by the second memory cell based on charge loss of the first memory cell, program disturbance, and lateral charge spreading.

12. The access method of claim 1, wherein the distance of the threshold voltage variation of the first memory cell corresponds to a difference between a first threshold voltage state prior to programming of the first memory cell and a second threshold voltage state after programming of the first memory cell.

13. The access method of claim 12, wherein the distance has one of a plurality of distance values, and each of the sub-distributions corresponds to one of the plurality of distance values.

14. The access method of claim 12, wherein the distance has one of a plurality of distance values, and at least two of the sub-distributions correspond to each of the plurality distance values.

15. The access method of claim 14, wherein the plurality of sub-distributions includes at least a first sub-distribution and a second sub-distribution, the first sub-distribution corresponding to a distance value resulting from the first threshold voltage state being an erase state and the second threshold voltage state being a program state, and the second sub-distribution corresponding a distance value resulting from the first threshold voltage state being a program state.

16. A memory system comprising:

a non-volatile memory device; and a memory controller configured to control the non-volatile memory device, the memory controller being configured to access the non-volatile memory device according to an access method of claim 1.

* * * * *